(12) United States Patent
Ushida et al.

(10) Patent No.: US 8,593,000 B2
(45) Date of Patent: Nov. 26, 2013

(54) SEMICONDUCTOR DEVICE AND MANUFACTURING METHOD THEREOF

(75) Inventors: Fumio Ushida, Yokohama (JP); Shigeki Yoshida, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 279 days.

(21) Appl. No.: 12/976,091

(22) Filed: Dec. 22, 2010

(65) Prior Publication Data

US 2011/0156286 A1 Jun. 30, 2011

(30) Foreign Application Priority Data

Dec. 25, 2009 (JP) ................................. 2009-294650

(51) Int. Cl.
*H01L 23/544* (2006.01)
*H01L 21/76* (2006.01)

(52) U.S. Cl.
USPC ............................ 257/797; 438/401; 356/399

(58) Field of Classification Search
USPC ............. 257/797, E23.179, E21.54; 438/401; 356/399–401
See application file for complete search history.

(56) References Cited

U.S. PATENT DOCUMENTS

| 6,133,641 | A | 10/2000 | Hamada et al. | |
|---|---|---|---|---|
| 7,236,244 | B1 * | 6/2007 | Yang et al. | 356/400 |
| 7,288,836 | B2 * | 10/2007 | Chia et al. | 257/686 |
| 2005/0064676 | A1 * | 3/2005 | Tobioka et al. | 438/401 |
| 2009/0206411 | A1 * | 8/2009 | Koketsu et al. | 257/368 |
| 2009/0218678 | A1 * | 9/2009 | Kawabata et al. | 257/698 |
| 2010/0240192 | A1 * | 9/2010 | Nakajima | 438/401 |

FOREIGN PATENT DOCUMENTS

| JP | 2947196 B2 | 9/1999 |
|---|---|---|
| JP | 3572555 B2 | 10/2004 |

OTHER PUBLICATIONS

Japanese Office Action dated Aug. 13, 2013, issued in Japanese Patent Application No. 2009-294650, w/ English translation.

* cited by examiner

*Primary Examiner* — Hsien Ming Lee
(74) *Attorney, Agent, or Firm* — Westerman, Hattori, Daniels & Adrian, LLP

(57) ABSTRACT

A semiconductor device includes an alignment mark formed over a semiconductor substrate and an inhibition pattern arranged over the alignment mark with a pattern edge of the inhibition pattern located in a mark functional region of the alignment mark in order to inhibit the alignment mark being recognized as such by an image detector of an exposure device.

18 Claims, 22 Drawing Sheets

FRAME AREA OF ANOTHER MARK

SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2009-294650, filed on Dec. 25, 2009 the entire contents of which are incorporated herein by reference.

FIELD

The embodiments discussed herein are related to a semiconductor device that provides alignment marks for a lithography and manufacturing method thereof.

BACKGROUND

As a method to detect a wafer alignment mark by an exposure device, there is an image processing method. In the image processing method, an alignment mark over a wafer that exists in the field of view is monitored by an alignment scope mounted on the exposure device and is captured in the device, for example, by a charge-coupled device (CCD) camera as an alignment mark image. The captured alignment mark image is compared with a template figure that is set in the device to detect a specific alignment mark and a deviation amount of a wafer position is measured.

An alignment mark that is not a detection target could be erroneously detected if two or more alignment marks with substantially the same size exist in the field of view of the alignment scope when an alignment mark is detected. Therefore, an arrangement interval of alignment marks is determined based generally on a limitation according to a performance of an exposure device.

Related art of the present disclosure:
Patent document 1: Japanese Patent. No. 2947196
Patent document 2: Japanese Patent. No. 3572555

Alignment marks are often arranged over a scribe region of a semiconductor wafer. However, various process patterns with different sizes such as an alignment mark, an inspection mark, a monitor for process control are arranged over the scribe region of a general semiconductor wafer. Accordingly, arranging the desired number of image processing application marks over a scribe region with a certain interval has been difficult.

Moreover, there is a case in which a chip dedicated to a process pattern is provided to arrange an image processing application mark in the chip. However, arranging the desired number of image processing application marks with a certain interval requires a large number of chips dedicated to process patterns. As a result, the yield of product chips may be reduced.

SUMMARY

According to one aspect of the invention, a semiconductor device includes an alignment mark formed over a semiconductor substrate; and an inhibition pattern arranged over the alignment mark with a pattern edge of the inhibition pattern in a mark functional region of the alignment mark to inhibit the alignment mark is recognized as the alignment mark by an image detector of an exposure device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DETAILED DESCRIPTION OF THE EMBODIMENTS

First Embodiment

A semiconductor device and manufacturing method thereof according to the first embodiment will be described by referring to FIG. 1 to FIG. 9C.

Figure 1:
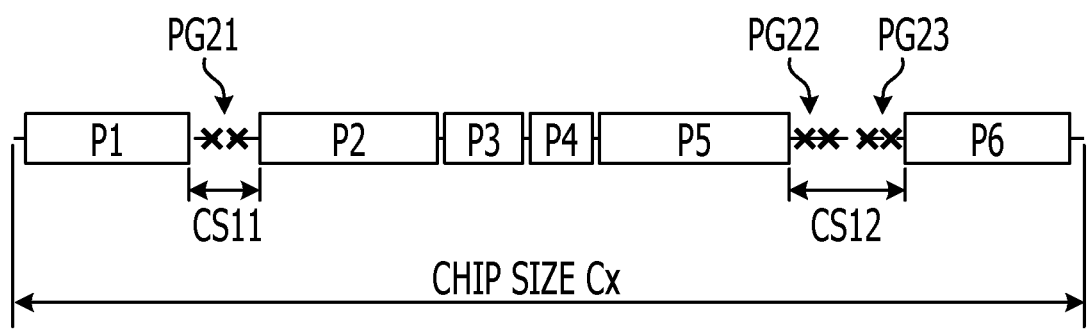
FIG. 1 is a plan view illustrating a structure of a semiconductor device according to a first embodiment.
Figure 2:
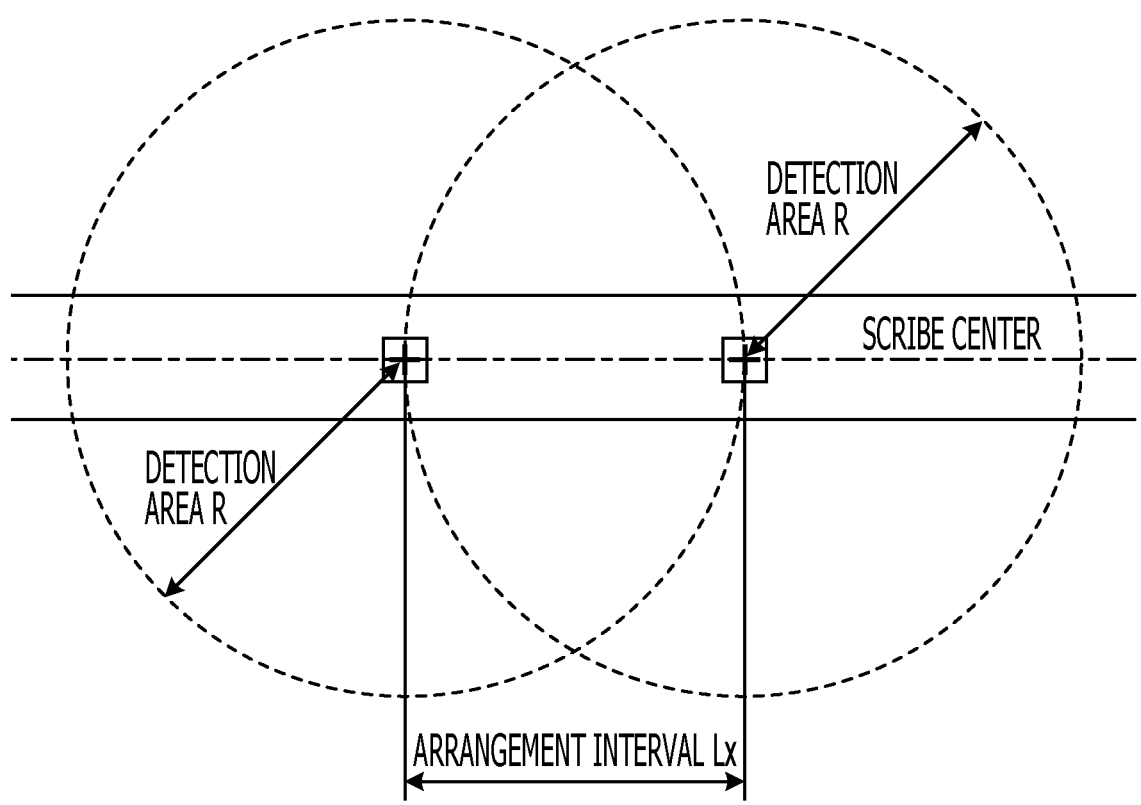
FIG. 2 is a plan view illustrating a relationship between an arrangement interval of image processing application marks and detection areas of an alignment scope.
Figure 3A:
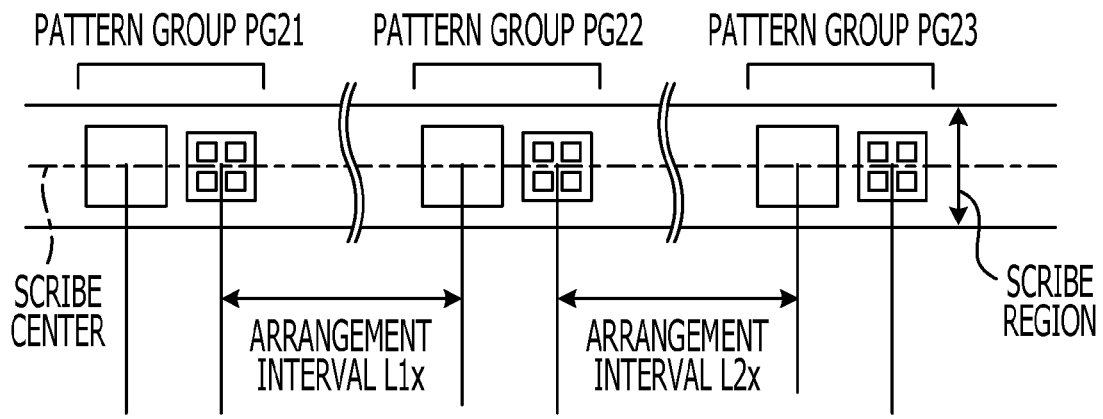
FIG. 3A is a plan view and FIG. 3B is a schematic sectional view illustrating a structure of the semiconductor device according to the first embodiment.
Figure 3B:
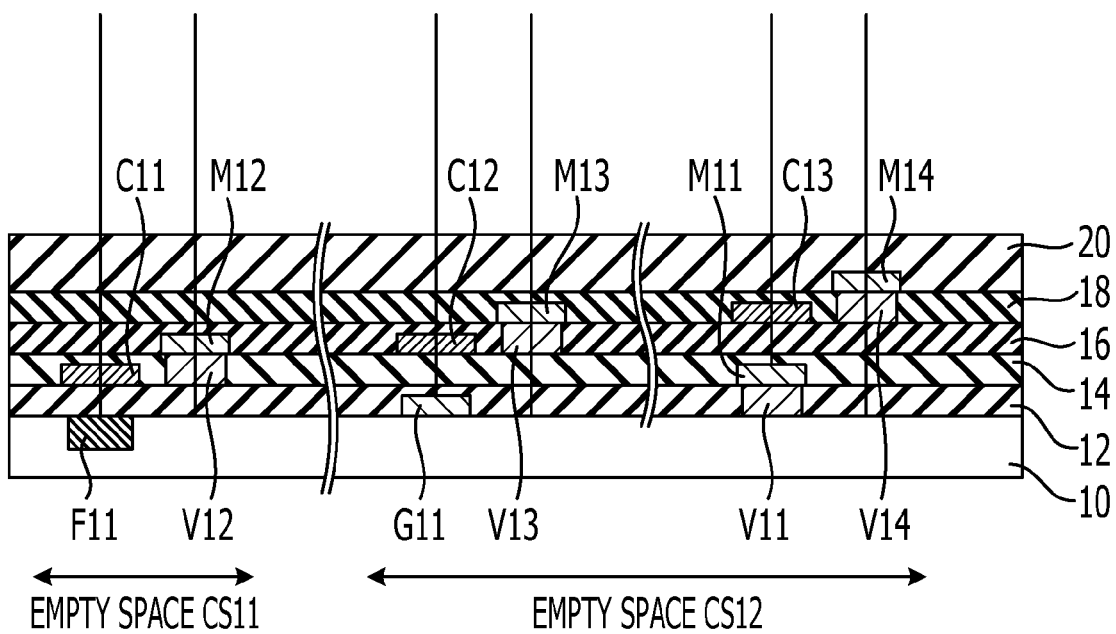
Figure 4:
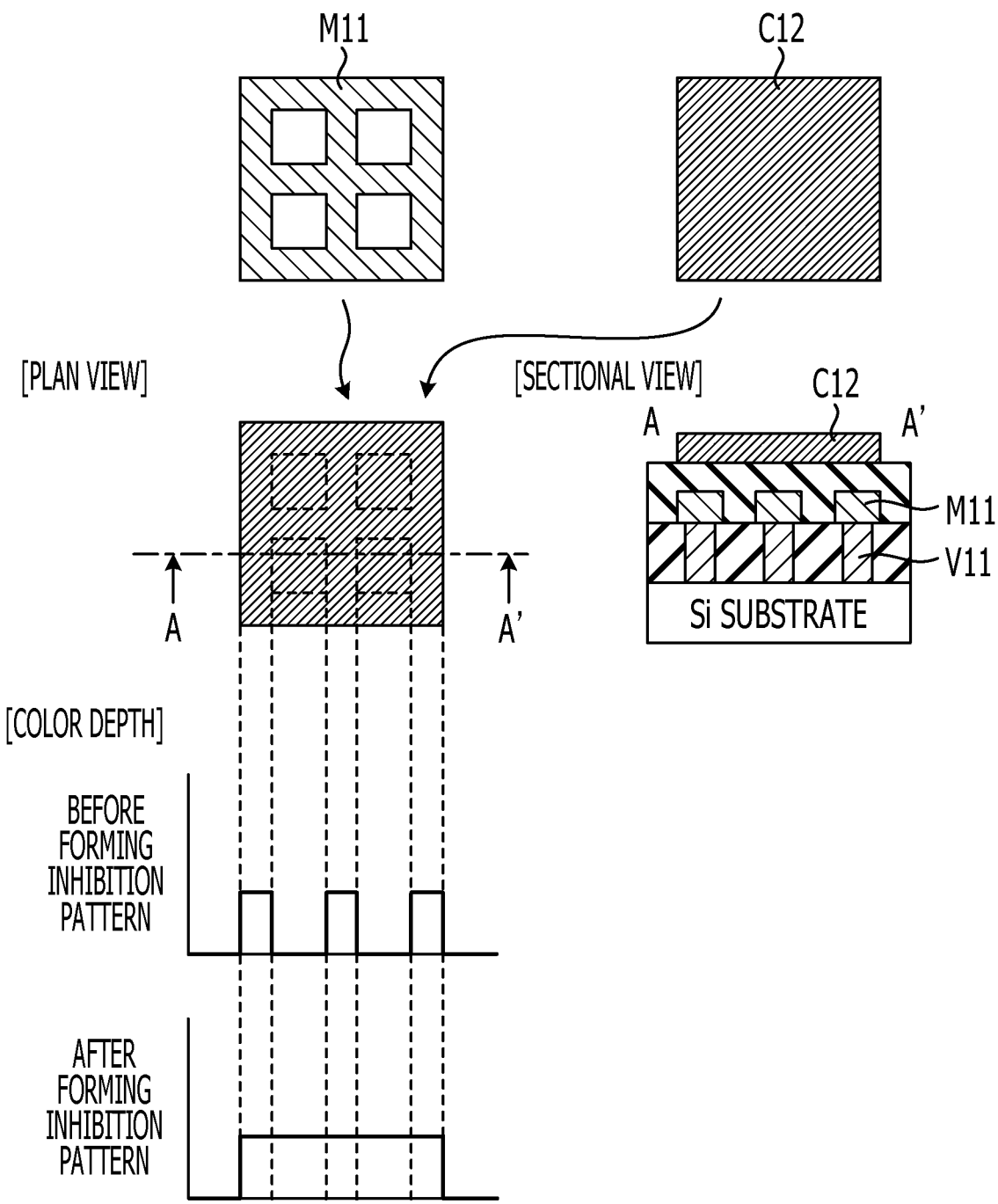
FIG. 4 illustrates how a mark image is changed by an image processing inhibition pattern (1 of 3)
Figure 5:
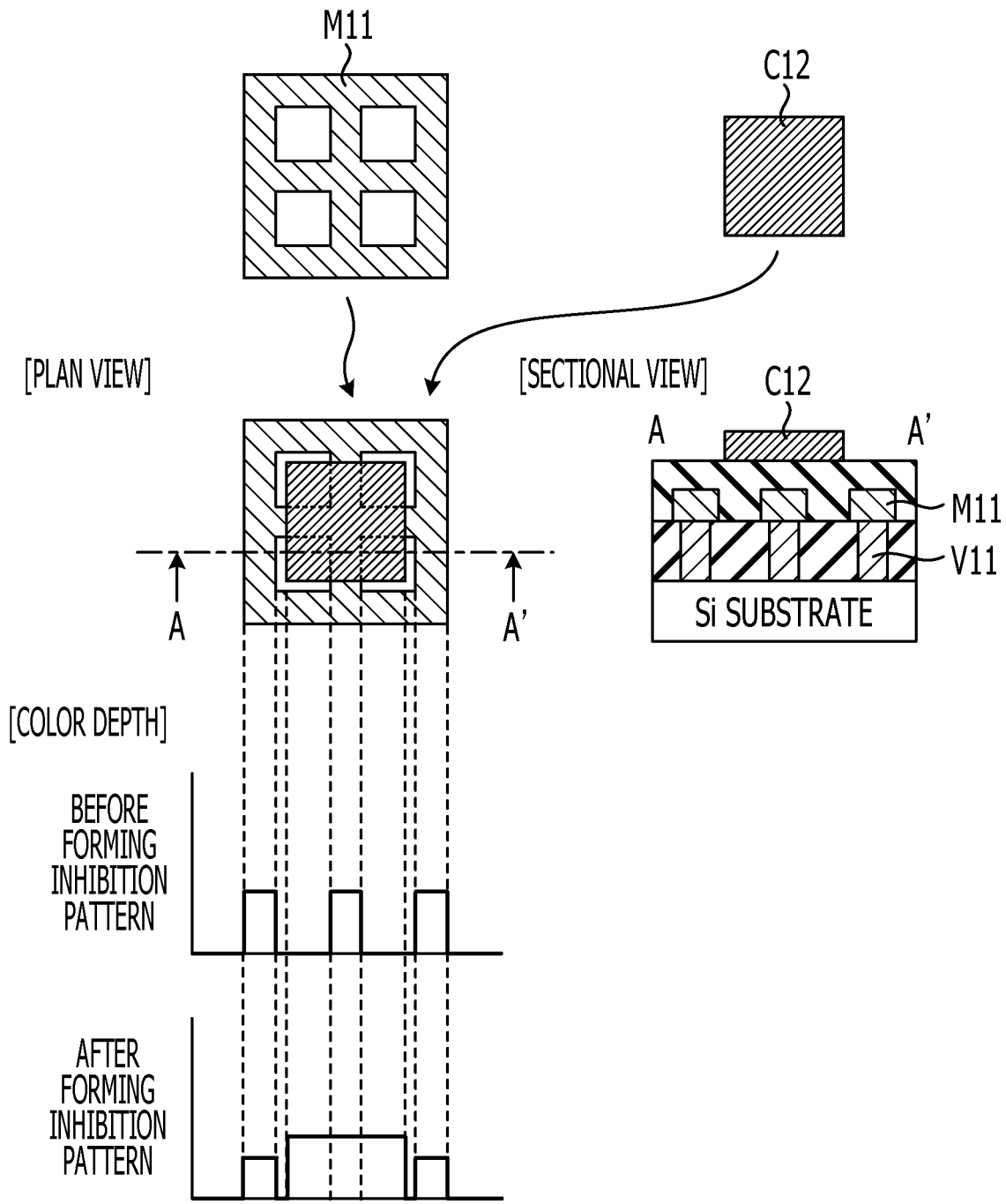
FIG. 5 illustrates how a mark image is changed by an image processing inhibition pattern (2 of 3)
Figure 6:
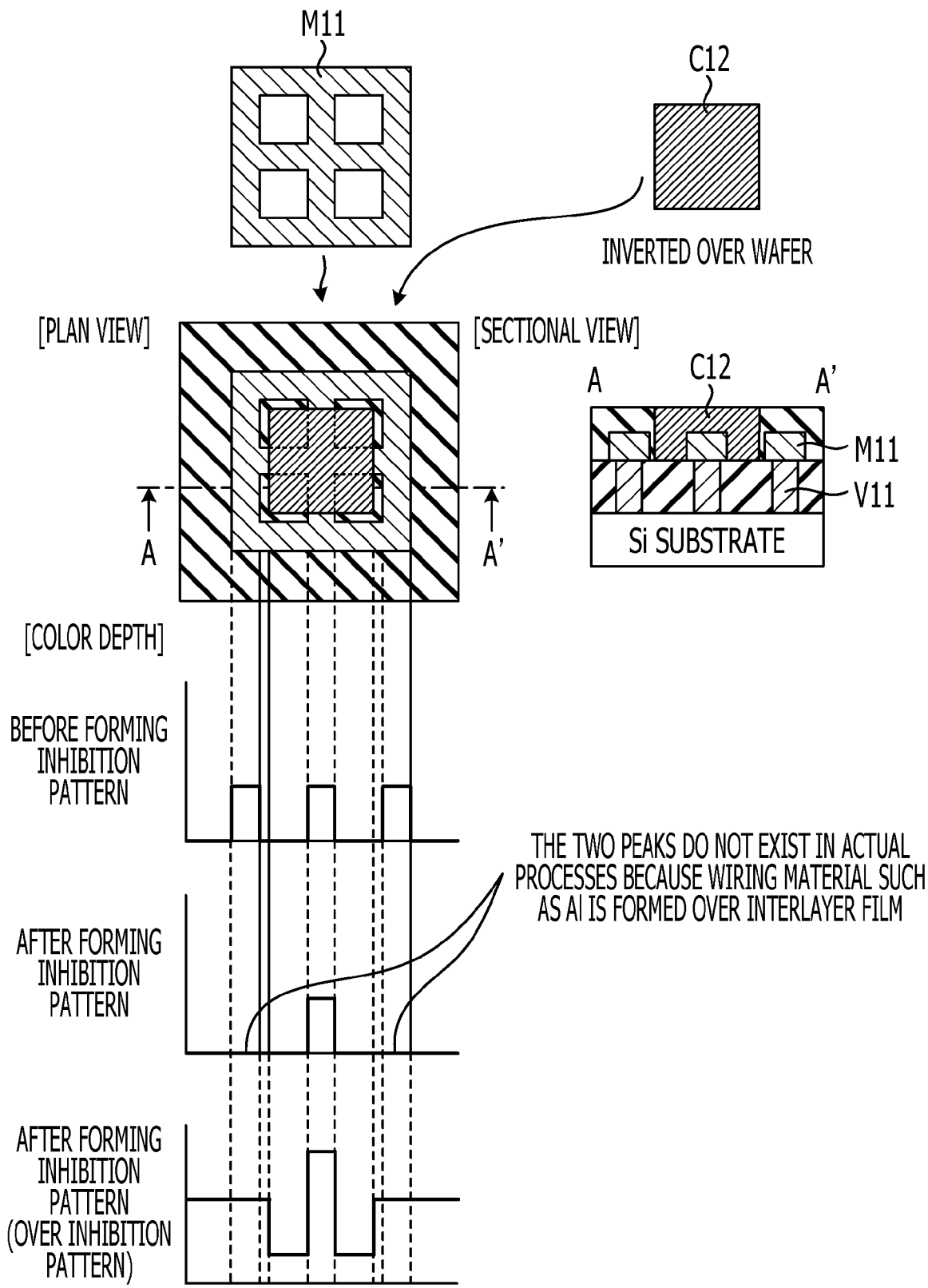
FIG. 6 illustrates how a mark image is changed by an image processing inhibition pattern (3 of 3)
Figure 7A:
FIGS. 7A to 7P are plan views illustrating examples of image processing inhibition patterns.

FIG. 1 is a plan view illustrating a structure of the semiconductor device according to the embodiment. FIG. 2 is a plan view illustrating a relationship between an arrangement interval of image processing application marks and detection areas of an alignment scope. FIG. 3A is a plan view and FIG. 3B is a schematic sectional view illustrating a structure of the semiconductor device according to the embodiment. FIGS. 4 to 6 illustrate how a mark image is changed by image processing inhibition patterns. FIGS. 7A to 7P are plan views illustrating examples of image processing inhibition patterns. FIGS. 8 to 9C illustrates process sectional views illustrating a manufacturing method of the semiconductor device according to the embodiment.

The structure of the semiconductor device according to the embodiment will be described by referring to FIGS. 1 to 7P.

In the semiconductor device according to the embodiment, an image processing application mark (alignment mark) is arranged in a scribe region over a semiconductor wafer.

In the scribe region over the semiconductor wafer, for example, as illustrated in FIG. 1, various process pattern groups P1 to P6 are formed. Image processing application marks for lithography are formed in an empty space where the process pattern groups P1 to P6 are not formed.

In the example illustrated in FIG. 1, an empty space CS11 exists between process pattern groups P1 and P2 while an empty space CS12 exists between process pattern groups P5 and P6. In this case, image processing application marks for applying lithography may be allocated in the empty spaces CS11 and CS12, for example, as illustrated by a symbol, "x" in FIG. 1. Here, an image processing application mark pattern group PG21 is formed in the empty space CS11 while image processing application mark pattern groups PG22 and PG23 are formed in the empty space CS12.

An image processing application mark that is not a detection target could be erroneously detected if two or more image processing application marks with substantially the same size exist in the field of view of the alignment scope (image detector) when the exposure device detects an image processing application mark. Therefore, image processing application marks that could be erroneously detected are arranged so that a relationship of Lx>R is satisfied where R is an alignment scope detection area (radius), and Lx is an arrangement interval of image processing application marks, as shown in FIG. 2.

In the example of FIG. 3A, the pattern groups PG21, PG22, and PG23 are arranged so that an arrangement interval L1x between the pattern groups PG21 and PG22, and an arrangement interval L2x between the pattern groups PG22 and PG23 are larger than the alignment scope detection area R.

In the example of FIG. 1, the pattern group PG21 is formed in the empty space CS11 while pattern groups PG22 and PG23 are formed in the empty space CS12. However, as long as the relationship of L1x, L2x>R is satisfied, a place to form the pattern group PG21 is not limited to the above described place. For example, the process pattern groups P2, P3, P4, and P5 may be rearranged to form empty spaces between the process pattern groups P2 and P3, between the process pattern groups P3 and P4, or between the process pattern groups P4 and P5 to arrange the pattern group PG22 in the empty spaces. Alternatively, the pattern groups PG21 and PG22 may be formed in the empty space CS11. Further alternatively, the pattern groups PG21, PG22, and PG23 may be formed in one empty space.

As an example, a general semiconductor device with four-layer wirings is assumed. Ten types of image processing application marks are used as shown in FIG. 3B: a field alignment mark F11, a gate alignment mark G11, contact marks V11, V12, V13, and V14, wiring marks M11, M12, M13, and M14. The field alignment mark F11 is an image processing application mark formed in a process of forming a field oxide mask. The gate alignment mark G11 is an image processing application mark formed in a process of forming a gate electrode. The contact marks V11, V12, V13, and V14 are image processing application marks formed in processes of forming contact holes formed over a first interlayer insulation film 12, a second interlayer insulation film 14, a third interlayer insulation film 16, and a fourth interlayer insulation film 18 respectively. The wiring marks M11, M12, M13, and M14 are image processing application marks formed in processes of forming a first wiring layer, a second wiring layer, a third wiring layer and a fourth wiring layer respectively.

The above-described image processing application marks are classified into pattern groups and arranged in certain empty spaces.

The number of image processing application marks desired to form a semiconductor device are calculated. The image processing application marks are allocated into different pattern groups based on the order of processes in which the marks are used.

For example, in the above-described four-layer wiring semiconductor device, the following allocations (refer to FIGS. 3A and 3B) will be performed when there are pattern groups PG21, PG22, and PG23. The field alignment mark F11 is allocated to the pattern group PG21. The gate alignment mark G11 is allocated to the pattern group PG 22. The contact mark V11 and the wiring mark M11 are allocated to the pattern group PG 23. The contact mark V12 and the wiring mark M12 are allocated to the pattern group PG 21. The contact mark V13 and the wiring mark M13 are allocated to the pattern group PG 22. The contact mark V14 and the wiring mark M14 are allocated to the pattern group PG 23.

For each pattern group, an image processing inhibition pattern is arranged over the used image processing application mark when there is any image processing application mark to be formed or used by a process thereafter other than the used image processing application mark. The image processing inhibition pattern is formed over the used image processing application mark by using a wiring material for forming a wiring layer through the interlayer insulation film.

For example, as illustrated in FIGS. 3A and 3B, an image processing inhibition pattern C11 is arranged over the field alignment mark F11. An image processing inhibition pattern C12 is arranged over the gate alignment mark G11. An image processing inhibition pattern C13 is arranged over the wiring mark M11. The image processing inhibition pattern C11 is formed by a conductive material of the layer of the wiring mark M11. The image processing inhibition pattern C12 may be formed by the conductive material of the layer of the wiring mark M12. The image processing inhibition pattern C12 may be formed over the first interlayer insulation film by the conductive material of the layer of the wiring mark M11. The image processing inhibition pattern C13 may be formed by the conductive material of the layer of the wiring mark M13. The image processing inhibition pattern C13 may be formed over the second interlayer insulation film by the conductive material of the layer of the wiring mark M12.

In a detection process of an image processing application mark in the exposure device, halogen lamp light is irradiated to the image processing application mark over a semiconductor wafer and scattered light from the mark edge and light reflected from the mark surface are detected and are captured by the alignment scope as a mark image.

The captured mark image is binarized (process of converting a specified image into an image with two gradations of black and white) by using a specified color depth as a reference.

Pattern matching of the binarized mark image and a reference pattern (template) registered in the exposure device is performed and if the patterns match, the mark is determined to be an alignment mark. The determination is performed using a threshold of a degree of correlation as a reference.

The image processing inhibition pattern formed over the used image processing application mark is for changing the binarized mark image into a mark image with a pattern that differs from a reference pattern corresponding to the used image processing application mark. A limitation to arrange another image processing application mark over the used image processing application mark may be canceled out by forming an image processing inhibition pattern with a shape to change or conceal a position of a pattern edge of the used image processing application mark over the used image processing application mark. In other words, another image processing application mark may be arranged in a region where an interval with the used image processing application mark is equal to or less than the alignment scope detection area R.

FIGS. 4 to 6 illustrate an image how color depth is changed by forming the image processing inhibition pattern over the used image processing application mark.

FIG. 4 is an example in which the image processing inhibition pattern C12 with substantially the same size as the wiring mark M11 is formed over the wiring mark M11. FIGS. 5 and 6 illustrate examples in which the image processing inhibition pattern C12 that is smaller than the wiring mark M11 is formed over the wiring mark M11. FIG. 5 is an example in which the image processing inhibition pattern C12 is formed by a remaining pattern of the wiring material. FIG. 6 is an example in which the image processing inhibition pattern C12 is formed by a punched pattern of the interlayer insulation film.

In both cases, the mark image may be changed into a mark image that differs from the mark image before forming the image processing inhibition pattern by forming the image processing inhibition pattern over the used image processing application mark. Accordingly, an erroneous determination may be reduced if not prevented that the mark image obtained after forming the image processing inhibition pattern matches with a reference pattern corresponding to the used image processing application mark.

The image processing inhibition pattern is not specifically limited as long as the pattern changes or conceals a position of a pattern edge in a base image processing application mark. Other than the image processing inhibition patterns illustrated in FIGS. 4 to 6, for example, various patterns as illustrated in FIGS. 7A to 7P may be used. The dashed lines in FIGS. 7A to 7P indicate a mark functional region of the base image processing application mark.

Figure 7B:
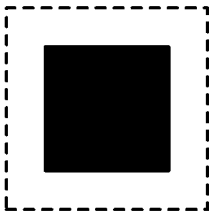
Figure 7C:
Figure 7D:
Figure 7E:
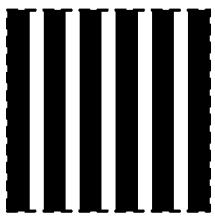
Figure 7F:
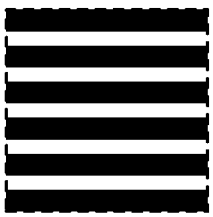
Figure 7G:
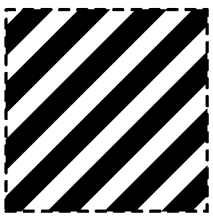
Figure 7H:
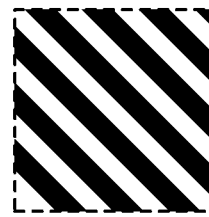
Figure 7I:
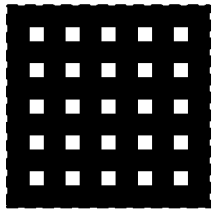
Figure 7J:
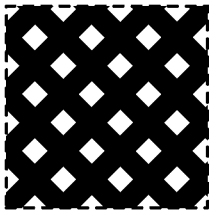
Figure 7K:
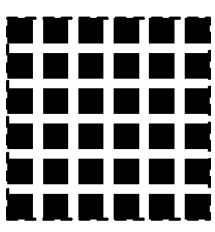
Figure 7L:
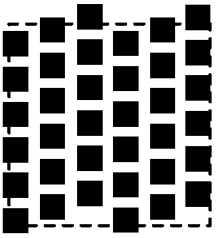
Figure 7M:
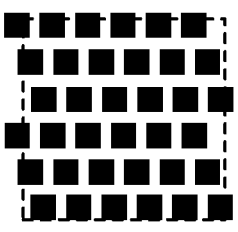
Figure 7N:
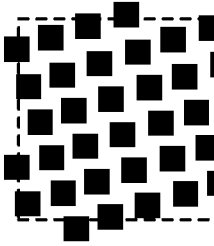
Figure 7O:
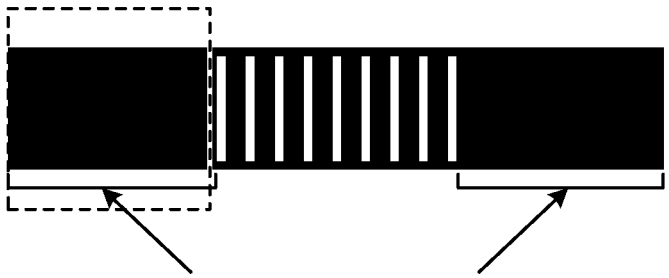
Figure 7P:
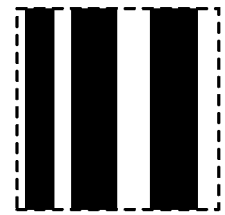
Figure 8A:
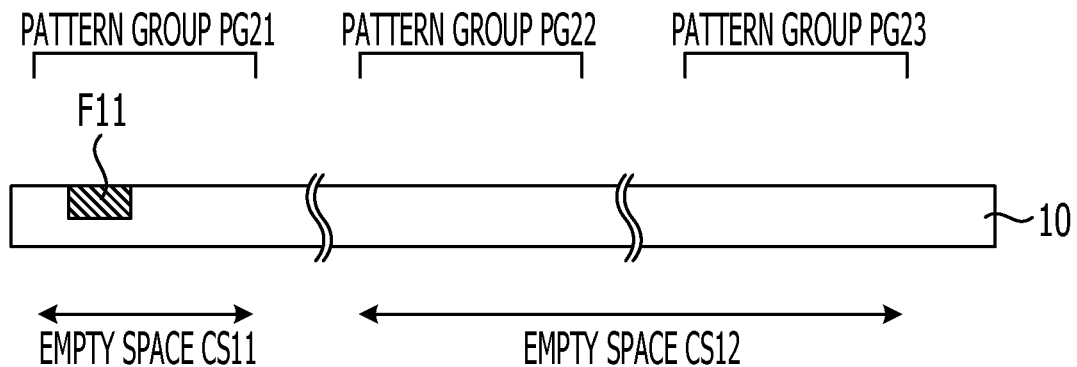
FIGS. 8A to 8K are process sectional views illustrating a manufacturing method of the semiconductor device according to the first embodiment.
Figure 8B:
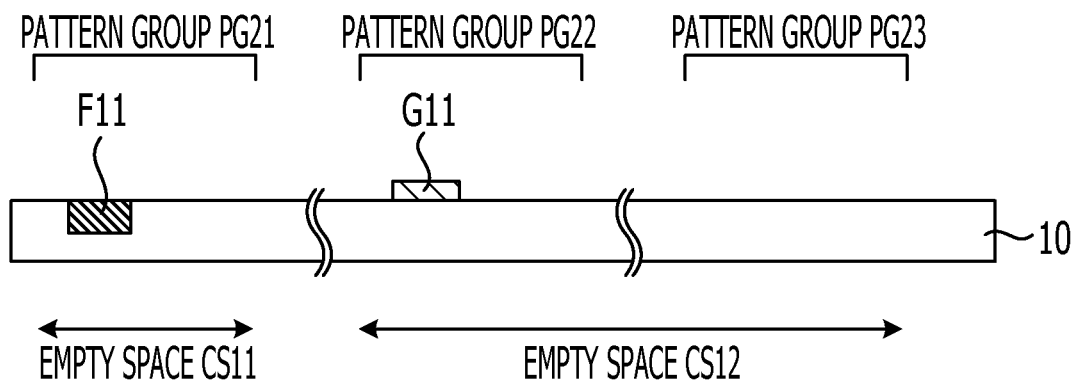
Figure 8C:
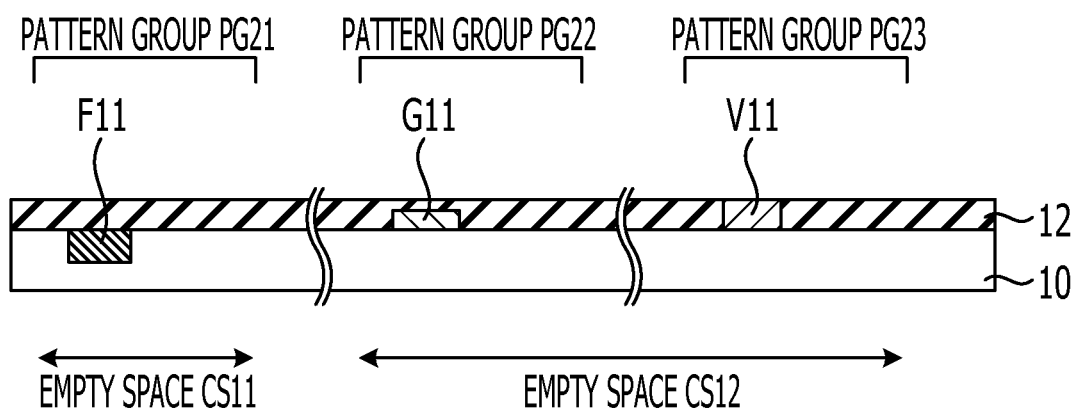
Figure 8D:
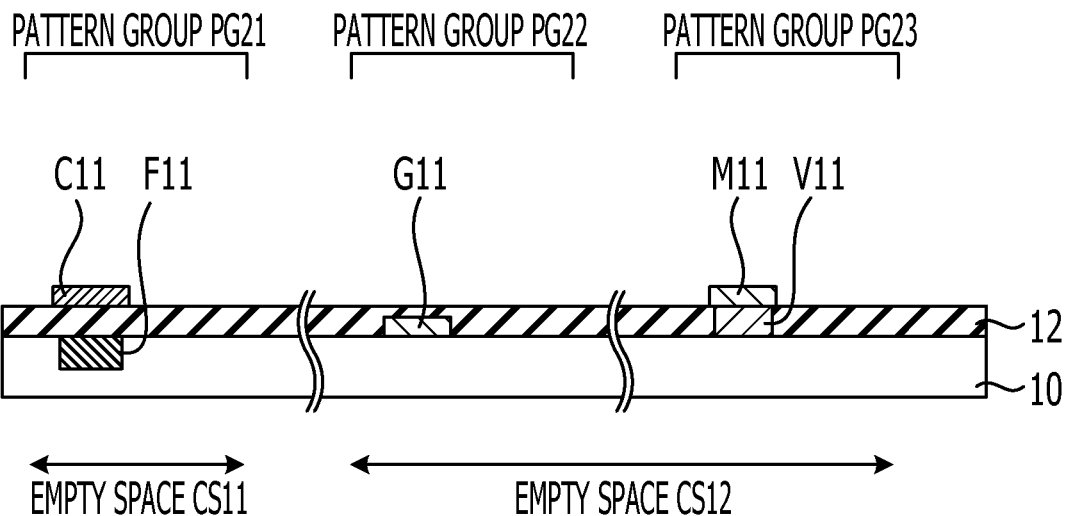
Figure 8E:
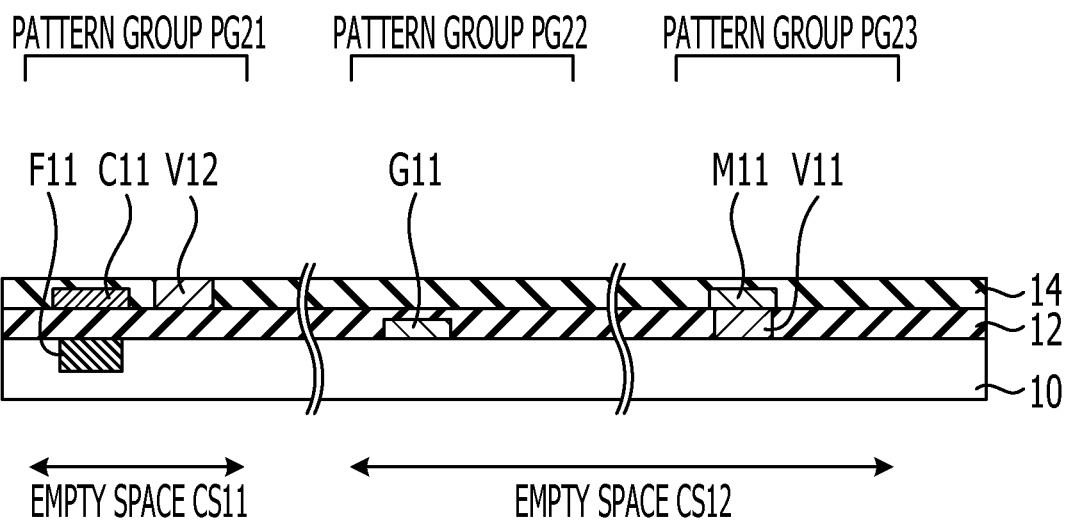
Figure 8F:
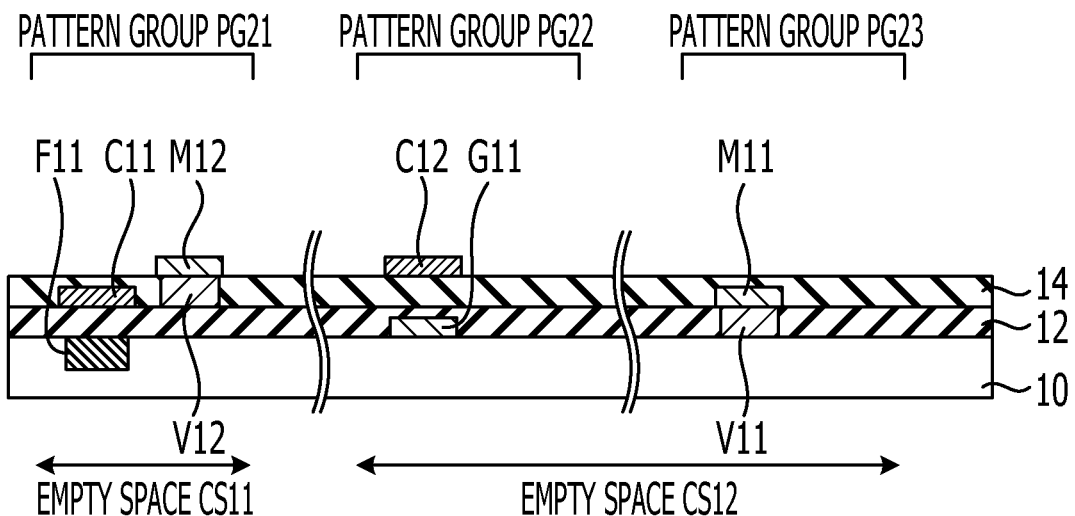
Figure 8G:
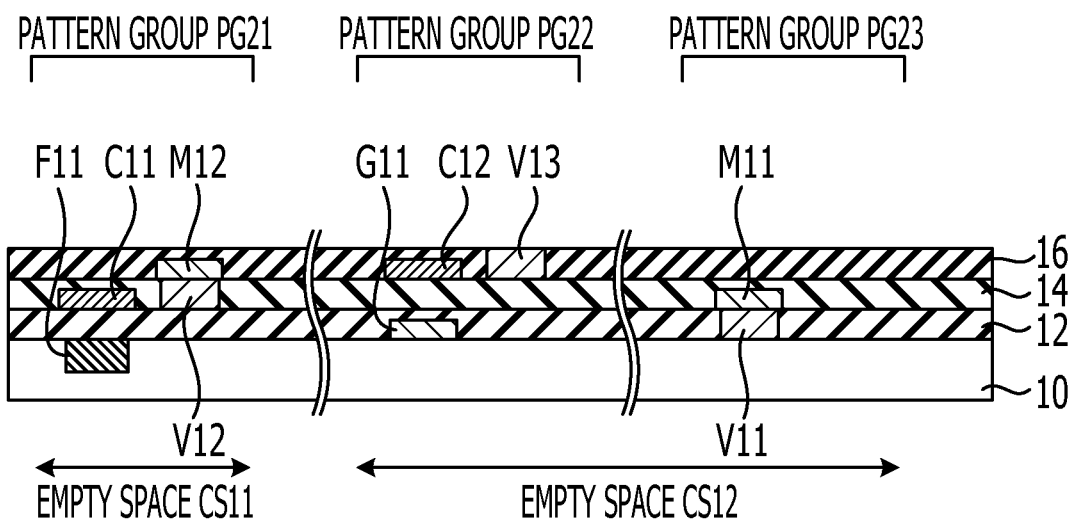
Figure 8H:
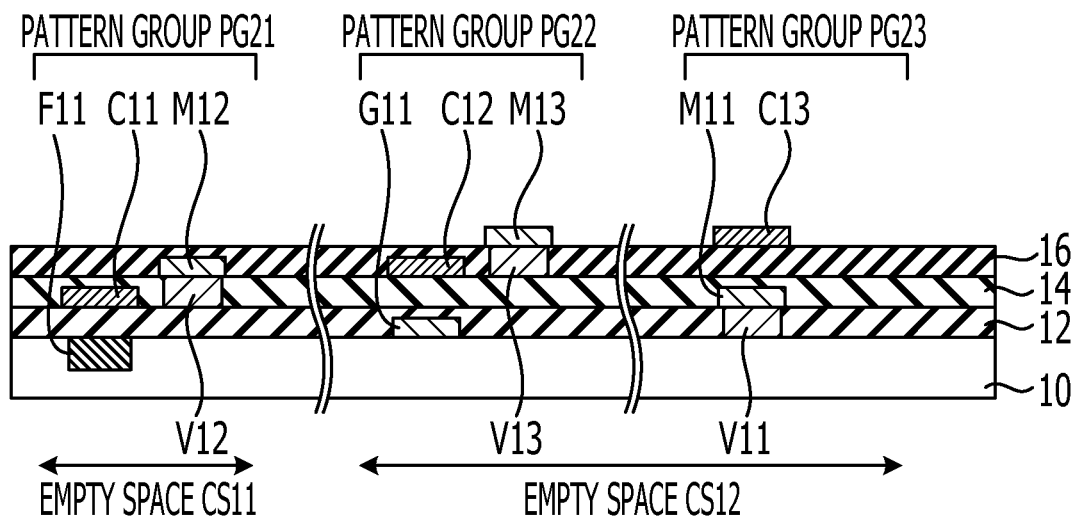
Figure 8I:
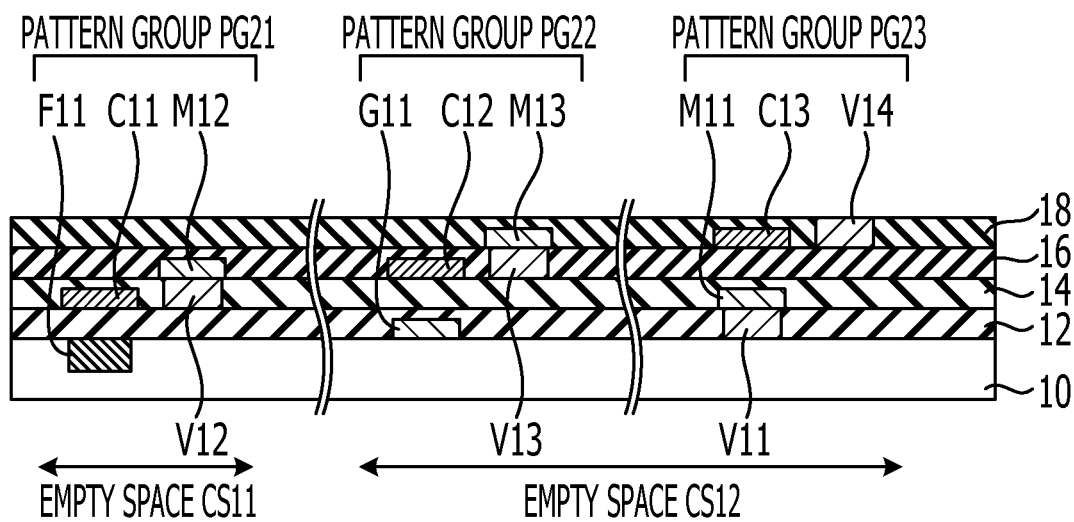
Figure 8J:
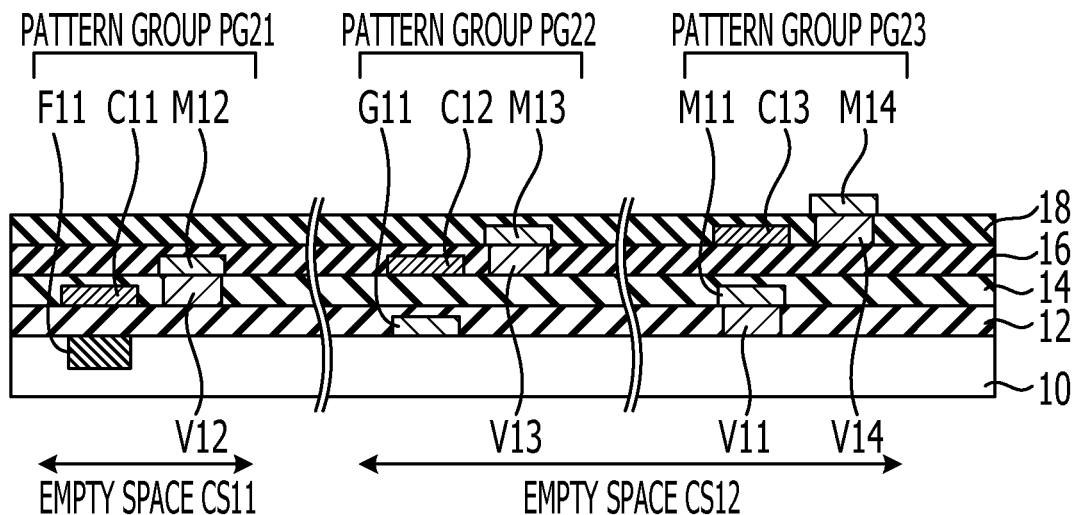

FIGS. 7A to 7D are examples of patterns formed by a simple rectangular figure. FIG. 7A is a pattern to cover the entire mark functional region of the base image processing application mark. FIGS. 7B to 7D are patterns that cover a portion of the mark functional region of the base image processing application mark. FIGS. 7E to 7H are examples of patterns formed with lines and spaces. FIG. 7I is a modified pattern obtained by superposing the pattern of FIG. 7E over a pattern of FIG. 7F. FIG. 7J is a modified pattern obtained by superposing the pattern of FIG. 7G over the pattern of FIG. 7H. FIGS. 7K to 7N are examples of patterns formed by arranging rectangular dummy patterns. FIG. 7O is an alternative example of a pattern that utilizes a frame area of another mark. FIG. 7P is an alternative example of a pattern that utilizes a wiring pattern in a device region that is not coupled to a lower layer.

Among the above-described patterns, the image processing inhibition pattern with a shape that changes a position of a pattern edge of a base image processing application mark is especially effective. This is because the pattern is not influenced by a flatness of a face where the image processing inhibition pattern is formed. The image processing inhibition pattern that changes a pattern edge of a base image processing application mark is, for example, an image processing inhibition pattern with a pattern edge inside a mark functional region of the base image processing application mark that differs from a pattern edge of the base image processing application mark.

For example, as illustrated in FIG. 7A, an image processing inhibition pattern that covers an entire mark functional region of the base image processing application mark may effectively conceals the base image processing application mark if the image processing inhibition pattern is formed over a surface of a planarized interlayer insulation film. However, if the surface of the interlayer insulation film is not planarized and the surface irregularities of the base image processing application mark is reflected to the surface of the interlayer insulation film, the surface irregularities of the base image processing application mark may be reflected to a surface of the image processing inhibition pattern formed thereover. In this case, the surface irregularities reflected over the surface of the image processing inhibition pattern may be recognized by image processing, and thereby the image processing inhibition pattern may not function.

Meanwhile, for example, as illustrated in FIGS. 5 and 6, the image processing inhibition pattern that changes the pattern edge of the base image processing application mark forms a new pattern edge at a position, differs from the pattern edge of the base image processing application mark. Thus, an erroneous detection of the base image processing application mark may be reduced if not prevented even if surface irregularities of the base image processing application mark are reflected to a surface of the image processing inhibition pattern.

An image processing inhibition pattern may be formed by a remaining pattern of the wiring material or a punched pattern of the interlayer insulation film as illustrated in FIGS. 5 and 6.

A manufacturing method of the semiconductor device according to the embodiment will be described by referring to FIGS. 8A to 9C. FIGS. 8A to 9C are process sectional views in a scribe region of a semiconductor wafer. Hereinafter, a method to manufacture a semiconductor device with a four-layer wiring structure that includes a metal oxide semiconductor (MOS) transistor will be described by focusing on processes using image processing application marks.

A pattern of an element isolation trench (not illustrated) for burying a field oxide film is formed in a device region of a silicon substrate 10 by photolithography and dry etching. A pattern of a trench for a field alignment mark F11 is formed over a scribe line of the silicon substrate 10 (FIG. 8A). Here, the field alignment mark F11 is allocated to the pattern group PG21 and is formed over a left side region of an empty space CS11 over the scribe line.

A silicon oxide film, for example, with a thickness of 680 nm (not illustrated) is deposited over a whole surface of the silicon substrate 10, for example, by a Chemical Vapor Deposition (CVD) to bury the element isolation trench and the trench of the field alignment mark F11 by the silicon oxide film.

Surface irregularities formed by depositing the silicon oxide film are planarized, for example, by Chemical Mechanical Polishing (CMP).

Accordingly, a field oxide film (not illustrated) formed with the silicon oxide film buried in the element isolation trench is formed by so-called Shallow Trench Isolation (STI) and the silicon oxide film is buried in the trench of the field alignment mark F11.

A gate insulation film (not illustrated) that is a silicon oxide film is formed by depositing a silicon oxide film, for example, with a thickness of 10 nm, for example, by the CVD over an active region of the silicon substrate 10 defined by the field oxide film.

A polycrystalline silicon film (not illustrated), for example, with a thickness of 180 nm, and a tungsten silicide film (not illustrated), for example, with a thickness of 20 nm are deposited over the whole surface, for example, by the CVD.

The tungsten silicide film and the polycrystalline silicon film are patterned by photolithography and dry etching to form a pattern of a gate electrode with a tungsten polycide structure (not illustrated). A pattern of a gate alignment mark G11 is formed over the scribe line by a conductive material that forms the gate electrode (FIG. 8B). The gate alignment mark G11 is allocated to the pattern group PG22 and is formed over a left side region of an empty space CS12 over the scribe line.

In the photolithography, a position is aligned using the field alignment mark F11 formed over the scribe line as a reference and the photo resist film is patterned.

A silicon oxide film, for example, with a thickness of 1000 nm is deposited over the whole surface, for example, by the CVD and the surface of the deposited silicon oxide film is planarized, for example, by the CMP to form the first interlayer insulation film 12 that is a silicon oxide film.

Figure 9A:
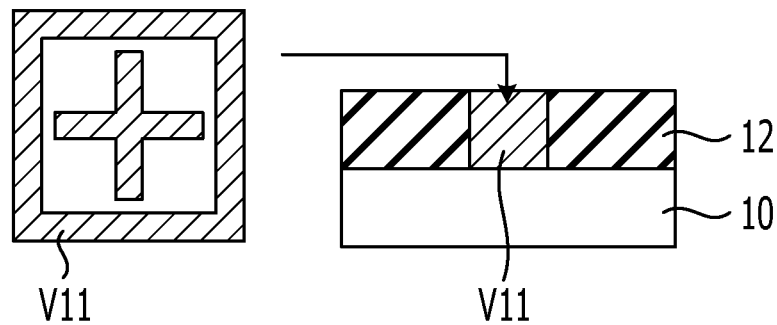
FIGS. 9A to 9C are plan views and schematic views illustrating the manufacturing method of the semiconductor device according to the first embodiment.

A pattern of a contact hole (for example, a substrate contact and a gate contact) (not illustrated) for coupling with a semiconductor device formed over a device region is formed over the first interlayer insulation film 12 by photolithography and dry etching. A pattern of the contact mark V11 is formed over the scribe line by an opening formed in the first interlayer insulation film 12 (FIG. 8C). The contact mark V11 is, for example, as illustrated in FIG. 9A has a cross-shaped pattern. Here, the contact mark V11 is allocated to the pattern group PG23 and is formed over a right side region of the empty space CS12 over the scribe line.

In the photolithography, a position is aligned using the field alignment mark F11 or the gate alignment mark G11 formed over the scribe line as a reference and the photo resist film is patterned.

A conductive film such as tungsten, for example, with a thickness of 300 nm is deposited over the first interlayer insulation film 12, for example, by the CVD. The conductive film over the first interlayer insulation film is removed, for example, by the CMP to leave the conductive film in the contact hole and the trench of the contact mark V11. As a result, a first contact plug (not illustrated) of the conductive film is formed in the contact hole.

A conductive film such as aluminum (not illustrated), for example, with a thickness of 500 nm is formed, for example, by Physical Vapor Deposition (PVD) over the first interlayer insulation film 12 in which the first contact plug is buried.

A conductive film is patterned by photolithography and dry etching to form a pattern of a first wiring layer (not illustrated) that is coupled to the device region through the first contact plug. Patterns of the wiring mark M11 and the image processing inhibition pattern C11 are formed over the scribe line by a conductive material that forms the first wiring layer (FIG. 8D). Here, the wiring mark M11 is allocated to the pattern group PG23, and is formed over the contact mark V11 in the empty space CS12 over the scribe line. The image processing inhibition pattern C11 is allocated to the pattern group PG21 and is formed over the field alignment mark F11 in the empty space CS11 over the scribe line.

Figure 9B:
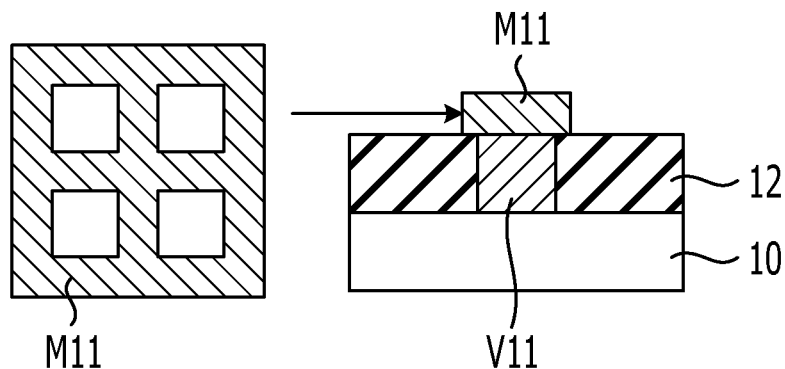

The wiring mark M11, for example, as illustrated in FIG. 9B conceals the contact mark V11 and forms a new image processing application mark. The contact mark V11 beneath the wiring mark M11 is not detected as an image processing application mark by an exposure process of lithography thereafter because of the wiring mark M11. The field alignment mark F11 beneath the image processing inhibition pattern C11 is not detected as an image processing application mark by an exposure process of lithography thereafter because of the image processing inhibition pattern C11.

In the photolithography, a position is aligned using the contact mark V11 formed over the scribe line as a reference and the photo resist film is patterned.

A silicon oxide film, for example, with a thickness of 800 nm is deposited, for example, by the CVD over the first interlayer insulation film 12 over which the first wiring layer is formed and the surface of the deposited silicon oxide film is planarized, for example, by the CMP to form the second interlayer insulation film 14 that is a silicon oxide film.

A pattern of a contact hole (not illustrated) for coupling with the first wiring layer is formed over the second interlayer insulation film 14 by photolithography and dry etching. A pattern of the contact mark V12 is formed over the scribe line by an opening formed in the second interlayer insulation film 14 (FIG. 8E). Here, the contact mark V12 is allocated to the pattern group PG21 and is formed with a margin for aligning a position over a right side of a region where the field alignment mark F11 and the image processing inhibition pattern C11 are formed in the empty space CS11 over the scribe line.

In the photolithography, a position is aligned using the wiring mark M11 formed over the scribe line as a reference and the photo resist film is patterned.

A conductive film such as tungsten, for example, with a thickness of 300 nm is deposited over the second interlayer insulation film 14, for example, by the CVD. The conductive film over the second interlayer insulation film is removed, for example, by the CMP to leave the conductive film in the contact hole and the trench of the contact mark V12. As a result, a second contact plug (not illustrated) of the conductive film is formed in the contact hole.

A conductive film such as aluminum, for example, with a thickness of 500 nm is formed, for example, by the PVD over the second interlayer insulation film 14 in which the second contact plug is buried.

A conductive film is patterned by photolithography and dry etching to form a pattern of a second wiring layer (not illustrated) that is coupled to the first wiring layer through the second contact plug. Patterns of the wiring mark M12 and the image processing inhibition pattern C12 are formed over the scribe line by a conductive material that forms the second wiring layer (FIG. 8F). Here, the wiring mark M12 is allocated to the pattern group PG 21, and is formed over the contact mark V12 in the empty space CS11 over the scribe line. The image processing inhibition pattern C12 is allocated to the pattern group PG 22 and is formed over the gate alignment mark G11 in the empty space CS12 over the scribe line.

The wiring mark M12 conceals the contact mark V12 and forms a new image processing application mark. The contact mark V12 beneath the wiring mark M12 is not detected as an image processing application mark by an exposure process of lithography thereafter because of the wiring mark M12. Moreover, the gate alignment mark G11 beneath the image processing inhibition pattern C12 is not detected as an image processing application mark by an exposure process of lithography thereafter because of the image processing inhibition pattern C12.

In the photolithography, a position is aligned using the contact mark V12 formed over the scribe line as a reference and the photo resist film is patterned.

When a position is aligned using the contact mark V12 as a reference, the field alignment mark F11 exists in the image processing detection area. However, the image processing inhibition pattern C11 is formed over an upper layer of the field alignment mark F11, and therefore, the field alignment mark F11 is not erroneously detected in an image processing process for detecting the contact mark V12.

A silicon oxide film, for example, with a thickness of 800 nm is deposited, for example, by the CVD over the second interlayer insulation film 14 over which the second wiring layer is formed and the surface of the deposited silicon oxide film is planarized, for example, by the CMP to form the third interlayer insulation film 16 that is a silicon oxide film.

A pattern of a contact hole (not illustrated) for coupling with the second wiring layer is formed over the third interlayer insulation film 16 by photolithography and dry etching. A pattern of the contact mark V13 is formed over the scribe line by an opening formed in the third interlayer insulation film 16 (FIG. 8G). Here, the contact mark V13 is allocated to the pattern group PG22 and is formed with a margin for aligning a position over a right side of a region where the gate alignment mark G11 and the image processing inhibition pattern C12 are formed in the empty space CS12 over the scribe line.

In the photolithography, a position is aligned using the wiring mark M12 formed over the scribe line as a reference and the photo resist film is patterned.

When a position is aligned using the wiring mark M12 as a reference, the field alignment mark F11 exists in the image processing detection area. However, the image processing inhibition pattern C11 is formed over an upper layer of the field alignment mark F11, and therefore, the field alignment mark F11 is not erroneously detected in an image processing process for detecting the wiring mark M12.

A conductive film such as tungsten, for example, with a thickness of 300 nm is deposited over the third interlayer insulation film 16, for example, by the CVD. The conductive film over the third interlayer insulation film 16 is removed, for example, by the CMP to leave the conductive film in the contact hole and the trench of the contact mark V13. As a result, a third contact plug (not illustrated) of the conductive film is formed in the contact hole.

A conductive film such as aluminum, for example, with a thickness of 500 nm is formed, for example, by the PVD over the third interlayer insulation film 16 in which the third contact plug is buried.

A conductive film is patterned by photolithography and dry etching to pattern a third wiring layer (not illustrated) that is coupled to the second wiring layer through the third contact plug. Patterns of the wiring mark M13 and the image processing inhibition pattern C13 are formed over the scribe line by a conductive material that forms the third wiring layer (FIG. 8H). Here, the wiring mark M13 is allocated to the pattern group PG22, and is formed over the contact mark V13 in the empty space CS12 over the scribe line. Here, the image processing inhibition pattern C13 is allocated to the pattern group PG 23 and is formed over the wiring mark M11 in the empty space CS12 over the scribe line.

The wiring mark M13 conceals the contact mark V13 and forms a new image processing application mark. The contact mark V13 beneath the wiring mark M13 is not detected as an image processing application mark by an exposure process of lithography thereafter because of the wiring mark M13. The wiring mark M11 beneath the image processing inhibition pattern C13 is not detected as an image processing application mark by an exposure process of lithography thereafter because of the image processing inhibition pattern C13.

In the photolithography, a position is aligned using the contact mark V13 formed over the scribe line as a reference and the photo resist film is patterned.

When a position is aligned using the contact mark V13 as a reference, the gate alignment mark G11 exists in the image processing detection area. However, the image processing inhibition pattern C12 is formed over an upper layer of the gate alignment mark G11, and therefore, the gate alignment mark G11 is not erroneously detected in an image processing process for detecting the contact mark V13.

A silicon oxide film, for example, with a thickness of 800 nm is deposited, for example, by the CVD over the third interlayer insulation film 16 over which the third wiring layer is formed and the surface of the silicon oxide film is planarized, for example, by the CMP to form the fourth interlayer insulation film 18 that is a silicon oxide film.

A pattern of a contact hole (not illustrated) for coupling with the third wiring layer is formed over the fourth interlayer insulation film 18 by photolithography and dry etching. A pattern of the contact mark V14 is formed over the scribe line by an opening formed in the fourth interlayer insulation film 18 (FIG. 8I). The contact mark V14 is, for example, is allocated to the pattern group PG23 and is formed with a margin for aligning a position over a right side of a region where the contact mark V11 and the wiring mark M11 are formed in the empty space CS12 over the scribe line.

In the photolithography, a position is aligned using the wiring mark M13 formed over the scribe line as a reference and the photo resist film is patterned.

When a position is aligned using the wiring mark M13 as a reference, the gate alignment mark G11 exists in the image processing detection area. However, the image processing inhibition pattern C12 is formed over an upper layer of the gate alignment mark G11, and therefore, the gate alignment mark G11 is not erroneously detected in an image processing process for detecting the wiring mark M13.

A conductive film such as tungsten, for example, with a thickness of 300 nm is deposited over the fourth interlayer insulation film 18 for example, by the CVD. The conductive film over the fourth interlayer insulation film 18 is removed, for example, by the CMP to leave the conductive film in the contact hole and the trench of the contact mark V14. As a result, a fourth contact plug (not illustrated) of the conductive film is formed in the contact hole.

A conductive film such as aluminum, for example, with a thickness of 800 nm is formed, for example, by the PVD over the fourth interlayer insulation film 18 in which the fourth contact plug is buried.

A conductive film is patterned by photolithography and dry etching to pattern a fourth wiring layer (not illustrated) that is coupled to the third wiring layer through the fourth contact plug. The fourth wiring layer includes a lead-out wiring to a wire bonding pad, for example. A pattern of the wiring mark M14 is formed over the scribe line (FIG. 8J). The wiring mark M14 is allocated to the pattern group PG23 and is formed over the contact mark V14 in the empty space CS12 over the scribe line. The contact mark V14 beneath the wiring mark M14 is not detected as an image processing application mark by an exposure process of lithography thereafter because of the wiring mark V14.

In the photolithography, a position is aligned using the contact mark V14 formed over the scribe line as a reference and the photo resist film is patterned.

When a position is aligned using the contact mark V14 as a reference, the wiring mark M11 exists in the image processing detection area. However, the image processing inhibition pattern C13 is formed over an upper layer of the wiring mark M11, and therefore, the wiring mark M11 is not erroneously detected in an image processing process for detecting the contact mark V14.

Figure 8K:
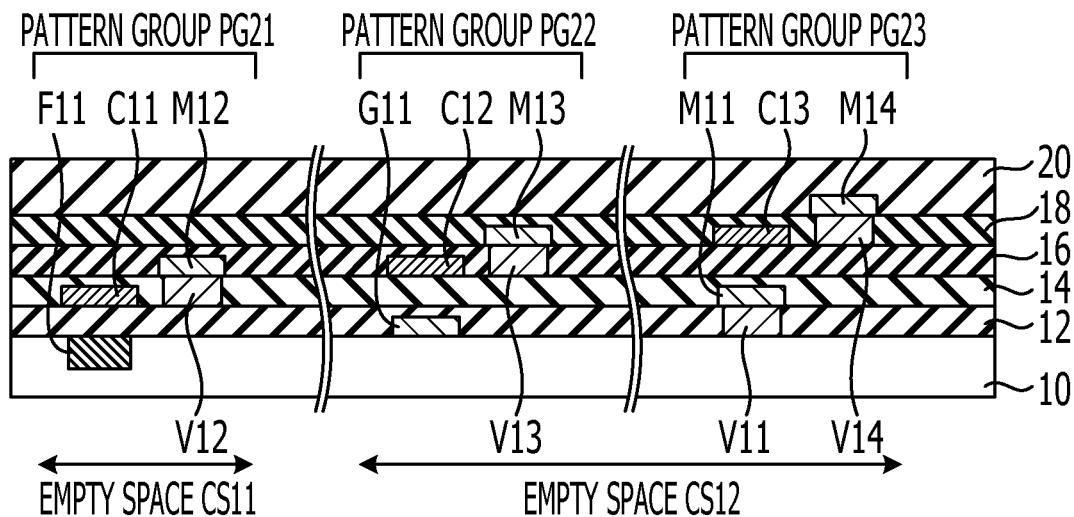
Figure 9C:
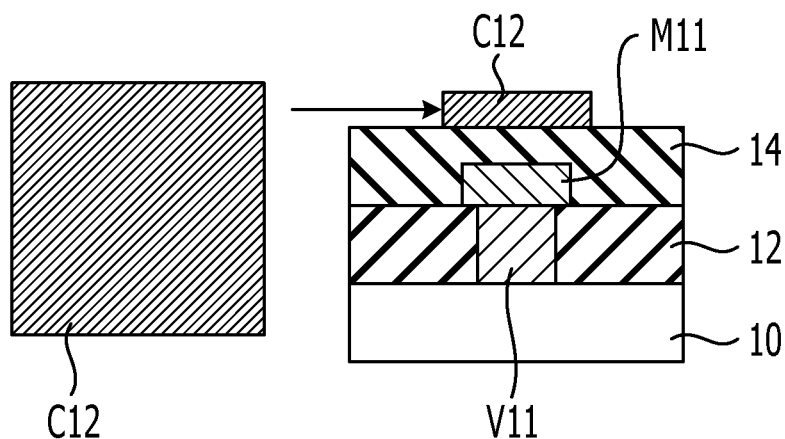

An insulation film with high water-proof property such as a Spin On Glass (SOG) film, for example, with a thickness of 1,200 nm is deposited, for example, by a spin coating method to form a passivation film 20 over the fourth interlayer insulation film 18 over which the fourth wiring layer is formed (FIG. 8K).

A pad opening (not illustrated) that reaches the fourth wiring layer is formed in the passivation film 20 by the photolithography and dry etching.

In the photolithography, a position is aligned using the wiring mark M14 formed over the scribe line as a reference and the photo resist film is patterned.

When a position is aligned using the wiring mark M14 as a reference, the wiring mark M11 exists in the image processing detection area. However, the image processing inhibition pattern C13 is formed over an upper layer of the wiring mark M11, and therefore, the wiring mark M11 is not erroneously detected in an image processing process for detecting the wiring mark M14.

The semiconductor device according to the embodiment is completed through the above-described processes.

As described above, according to the embodiment, a limitation to arrange another image processing application mark over the used image processing application mark may be canceled out because an image processing inhibition pattern with a shape that changes or conceals a position of a pattern edge of the used image processing application mark is formed over the used image processing application mark. As a result, a plurality of image processing application marks may be arranged within an area corresponding to one field of view of the image detector of the exposure device, and thereby flexibility to arrange image processing application marks may be improved. Moreover, an area to arrange the image processing application marks may be reduced.

Second Embodiment

A semiconductor device and manufacturing method thereof according to the second embodiment will be described by referring to FIGS. 10A and 10B, and FIG. 11. For components that are substantially the same as those of the first embodiment illustrated in FIG. 1 to FIG. 9, the same reference numerals as the first embodiment are assigned to the components of the semiconductor device and manufacturing method thereof according to the second embodiment and the components will not be described, or described briefly.

Figure 10A:
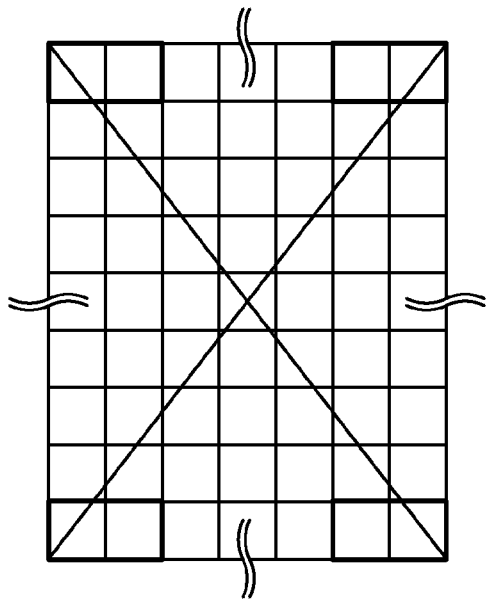
FIGS. 10A and 10B are plan views illustrating a structure of a semiconductor device according to a second embodiment.
Figure 10B:
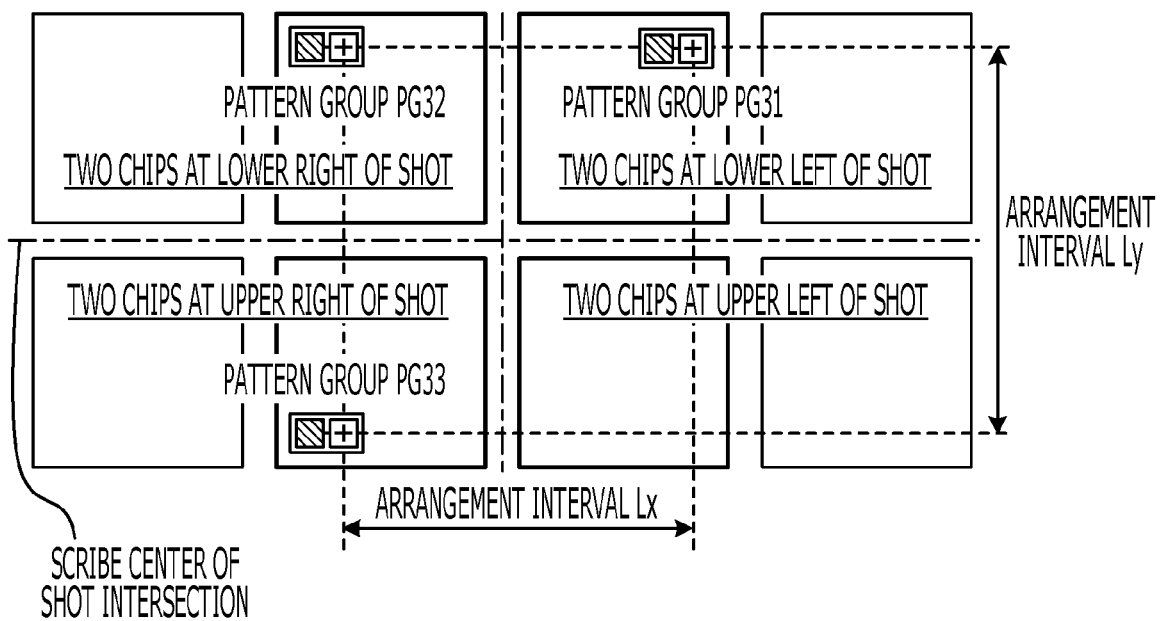
Figure 11:
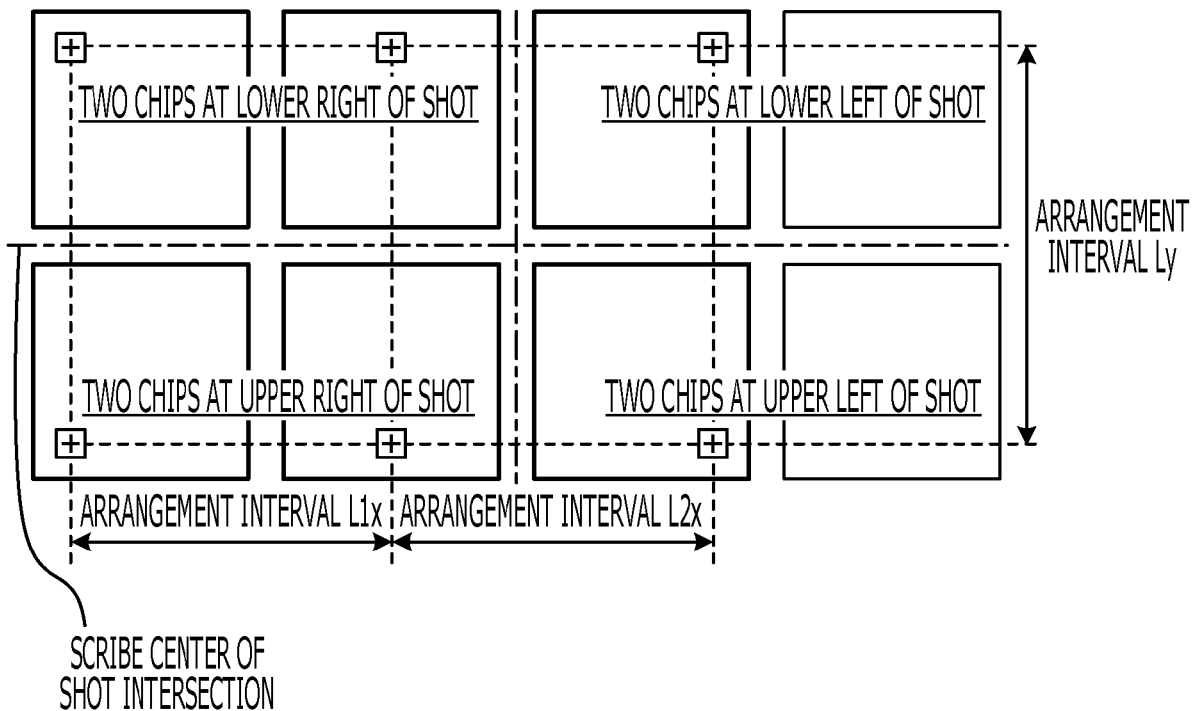
FIG. 11 is a plan view illustrating a structure of a semiconductor device that does not use an image processing inhibition pattern.

FIGS. 10A and 10B are plan views illustrating a structure of a semiconductor device according to the second embodiment. FIG. 11 is a plan view illustrating a structure of a semiconductor device that does not use an image processing inhibition pattern.

In the semiconductor device according to the first embodiment, an image processing application mark is formed in the empty space over the scribe line, however, a chip dedicated to a process pattern may be provided and an image processing application mark may be arranged in the chip.

FIG. 10A illustrates an image of one shot. In the example of FIG. 10A, 63 chips are included in one shot region. Here, among 63 chips, chips located at the corner part are assumed to be used for the chip dedicated to the process pattern.

FIG. 10B illustrates an image at an intersection of shots when a shot image of FIG. 10A is repeatedly exposed over a semiconductor wafer. Among eight chips illustrated in FIG. 10B, two chips at the upper right of FIG. 10B correspond to two chips at a lower left within an upper right shot (two chips at the lower left surrounded by a bold line in the image of FIG. 10A). Furthermore, two chips at the lower right of FIG. 10B correspond to two chips at an upper left within a lower right shot (two chips at the upper left surrounded by a bold line in the image of FIG. 10A). Moreover, two chips at the upper left of FIG. 10B correspond to two chips at the lower right within an upper left shot (two chips at the lower right surrounded by a bold line in the image of FIG. 10A). Furthermore, two chips at the lower left of FIG. 10B correspond to two chips at the upper right within a lower left shot (two chips at the upper right surrounded by a bold line in the image of FIG. 10A).

In the semiconductor device and manufacturing method thereof according to the first embodiment, pattern groups PG21, PG22, and PG23 are arranged over the scribe line. On the other hand, in the semiconductor device and manufacturing method thereof according to the second embodiment, pattern groups PG31, PG32, and PG33 that correspond to the pattern groups PG21, PG22, and PG23 respectively are arranged in chips dedicated to process patterns provided at corners of a shot.

The pattern groups PG31, PG32, and PG33 are arranged in the chips dedicated to process patterns so that Lx, Ly>R is satisfied, where Lx is an arrangement interval along an X direction, and Ly is an arrangement interval along a Y direction. Here, a chip size is, for example, 900 μm□, an alignment scope detection area R is, for example, 1000 μm, and the pattern groups PG31, PG32, and PG33 are arranged over different chips dedicated to process patterns (refer to FIG. 10B).

If the image processing inhibition patterns C11, C12, and C13 are not provided to the semiconductor device and manufacturing method thereof according to the first embodiment, six pattern regions are needed for forming the field alignment mark F11, the gate alignment mark G11, the contact mark V11 and the wiring mark M11, the contact mark V12 and the wiring mark M12, the contact mark V13 and the wiring mark M13, and the contact mark V14 and the wiring mark M14. The six regions need to satisfy the relationship of Lx, Ly>R each other. Thus, six chips dedicated to process patterns are desired to be provided in the above example in which the chip size is, for example, 900 μm□, and the alignment scope detection area R is, for example, 1,000 μm (refer to FIG. 11).

Providing image processing inhibition patterns C11, C12, and C13 to put image processing application marks into the pattern groups PG31, PG32, and PG33 may reduce the number of chips dedicated to process patterns that are needed for the image processing application marks to three. Accordingly, the yield of product chips may be improved.

The manufacturing method of the semiconductor device according to the second embodiment is substantially the same as that of the first embodiment other than places to arrange the pattern groups PG31, PG32, and PG33 are moved to the chips dedicated to process patterns.

According to the second embodiment, a limitation to arrange another image processing application mark over the used image processing application mark may be canceled out because an image processing inhibition pattern with a shape that changes or conceals a position of a pattern edge of the used image processing application mark is formed over the used image processing application mark. As a result, a plurality of image processing application marks may be arranged within an area corresponding to one field of view of the image detector of the exposure device, and thereby flexibility to arrange image processing application marks may be improved. Moreover, the number of chips dedicated to process patterns may be reduced, and thereby the yield of the product chips may be improved.

Third Embodiment

A semiconductor device and manufacturing method thereof according to the third embodiment will be described by referring to FIG. 12 to FIG. 14K. For components that are substantially the same as those of the first embodiment and the second embodiment illustrated in FIG. 1 to FIG. 11, the same reference numerals are assigned to the components of the semiconductor device and manufacturing method thereof according to the third embodiment, and the components will not be described, or described briefly.

Figure 12:
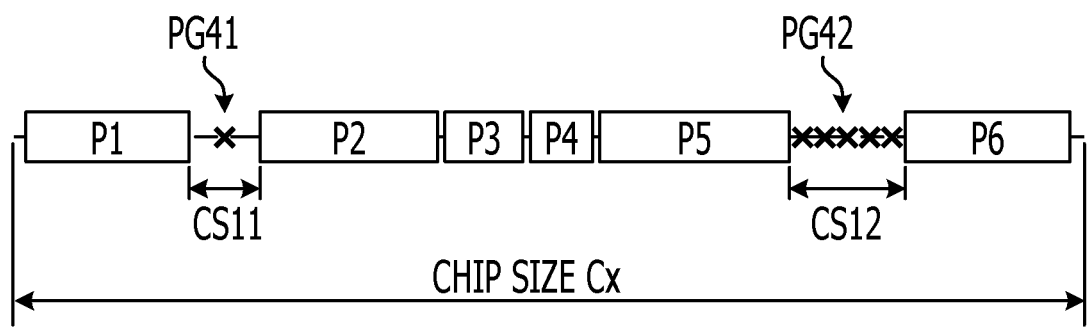
FIG. 12 is a plan view illustrating a structure of a semiconductor device according to a third embodiment.
Figure 13A:
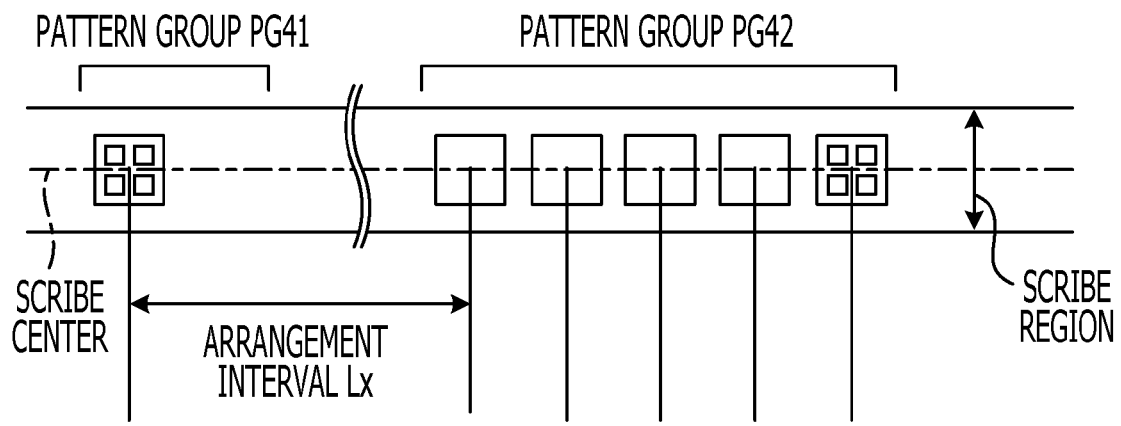
FIG. 13A is a plan view and 13B is a schematic view illustrating the structure of the semiconductor device according to the third embodiment.
Figure 13B:
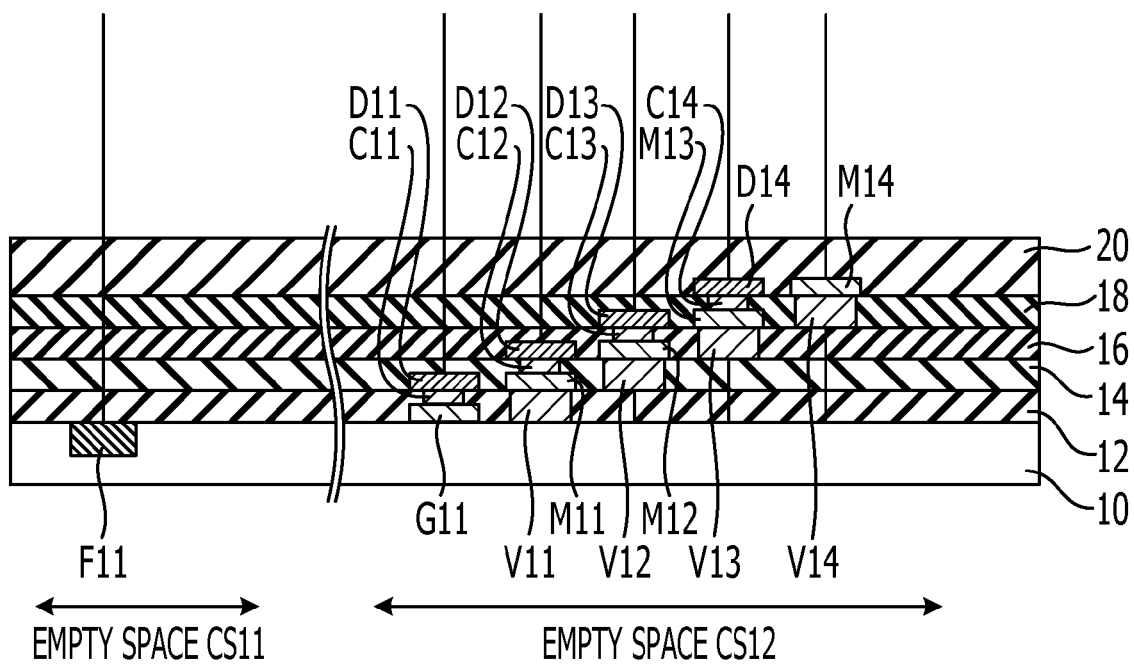

FIG. 12 is a plan view illustrating a structure of a semiconductor device according to the third embodiment. FIG. 13A is a plan view and FIG. 13B is a schematic view illustrating the structure of the semiconductor device according to the third embodiment.

FIGS. 14A to 14K are process sectional views illustrating a manufacturing method of the semiconductor device according to the third embodiment.

A semiconductor device and manufacturing method thereof according to the third embodiment will be described by referring to FIG. 12, FIGS. 13A and 13C.

In the semiconductor device according to the third embodiment, as in the first embodiment, an image processing application mark is arranged in a scribe region over a semiconductor wafer. However, as in the second embodiment, an image processing application mark may be arranged in a chip dedicated to a process pattern.

In a scribe region of a semiconductor wafer, for example, as illustrated in FIG. 12, various process pattern groups, P1 to P6 are formed. Image processing application marks for lithography are formed in empty spaces where pattern groups P1 to P6 are not formed.

In the example illustrated in FIG. 12, an empty space CS11 exists between the process pattern groups P1 and P2, while an empty space CS12 exists between the process pattern groups P5 and P6. In this case, image processing application marks for lithography may be allocated to the empty spaces CS11 and CS12, for example, as illustrated by a symbol, "x" in FIG. 1. Here, an image processing application mark pattern group PG41 is formed in the empty space CS11 while image processing application mark pattern group PG42 is formed in the empty space CS12. The pattern groups PG41 and PG42 are arranged so that a relationship of Lx>R is satisfied where R is an alignment scope detection area, and Lx is an arrangement interval between the pattern groups PG 41 and PG 42.

As an example, the above-described semiconductor device with four-layer wirings is assumed. Ten types of image processing application marks are used that are a field alignment mark F11, a gate alignment mark G11, contact marks V11, V12, V13, and V14, wiring marks M11, M12, M13, and M14.

The above-described image processing application marks are classified into pattern groups and arranged in certain empty spaces.

The number of image processing application marks desired to form a semiconductor device are calculated. The image processing application marks are allocated to different pattern groups based on the order of processes in which the marks are used.

The field alignment mark F11 is allocated to the pattern group PG41. The gate alignment mark G11, the contact mark V11 and the wiring mark M11, the contact mark V12 and the wiring mark M12, the contact mark V13 and the wiring mark M13, and the contact mark V14 and the wiring mark M14 are allocated to the pattern group PG42 (refer to FIGS. 13A and 13B).

For each pattern group, if there is any image processing application mark to be formed or used by a process thereafter other than the used image processing application mark, an image processing inhibition pattern is arranged over the used image processing application mark.

According to the third embodiment, an image processing inhibition pattern is formed by an opening formed in an interlayer insulation film over a wiring layer.

For example, as illustrated in FIGS. 13A and 13B, an image processing inhibition pattern C11 that is formed over a first interlayer insulation film 12 is arranged over the gate alignment mark G11. An image processing inhibition pattern C12 that is formed over a second interlayer insulation film 14 is arranged over the wiring mark M11. An image processing inhibition pattern C13 that is formed over a third interlayer insulation film 16 is arranged over the wiring mark M12. An image processing inhibition pattern C14 that is formed over a fourth interlayer insulation film 18 is arranged over the wiring mark M13. Cover patterns D11, D12, D13, and D14 are arranged over the image processing inhibition patterns C11, C12, C13, and C13 respectively.

As described above, an image processing inhibition pattern may be formed by an opening formed in an interlayer insulation film. The image processing inhibition pattern in this case is for changing a binarized mark image into a mark image with a pattern that differs from a reference pattern corresponding to the used image processing application mark. A limitation to arrange another image processing application mark over the used image processing application mark may be canceled out by forming an image processing inhibition pattern with a shape that changes a position of a pattern edge of the used image processing application mark over the used image processing application mark. In other words, another image processing application mark may be arranged in a region where an interval with the used image processing application mark is equal to or less than the alignment scope detection area R.

The cover patterns D11, D12, D13, and D14 reduce if not prevent a conductive film such as tungsten buried in trenches of the image processing inhibition patterns C11, C12, C13, and C14 from being peeled off that may be caused during respective subsequent wiring formation processes. For example, forming cover patterns by a conductive film such as aluminum over the image processing inhibition patterns C11, C12, C13, and C14 may alleviate a condition in which a shape that changes a position of a pattern edge of the used image processing application mark may not be maintained due to a cover pattern of a thin film such as tungsten.

A manufacturing method of the semiconductor device according to the third embodiment will be described by referring to FIGS. 14A to 14K.

Figure 14A:
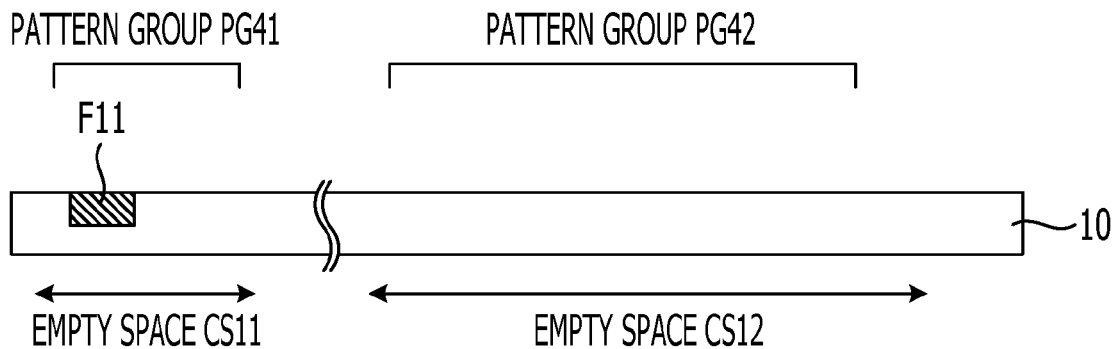
FIGS. 14A to 14K are process sectional views illustrating a manufacturing method of the semiconductor device according to the third embodiment.

A pattern of an element isolation trench (not illustrated) for burying a field oxide film is formed in a device region of a silicon substrate 10 by photolithography and dry etching. A pattern of a trench for the field alignment mark F11 is formed over a scribe line of the silicon substrate 10 (FIG. 14A). Here, the field alignment mark F11 is allocated to the pattern group PG41 and is formed over the empty space CS11 over the scribe line.

A silicon oxide film, for example, with a thickness of 680 nm (not illustrated) is deposited over a whole surface of the silicon substrate 10, for example, by a Chemical Vapor Deposition (CVD) to bury the element isolation trench and the trench of the field alignment mark F11.

Surface irregularities formed by depositing the silicon oxide film are planarized, for example, by Chemical Mechanical Polishing (CMP).

Accordingly, a field oxide film formed with the silicon oxide film buried in the element isolation trench is formed by Shallow Trench Isolation (STI) and the silicon oxide film is buried in the trench of the field alignment mark F11.

A gate insulation film (not illustrated) that is a silicon oxide film is formed by depositing a silicon oxide film, for example, with a thickness of 10 nm, for example, by the CVD over an active region of the silicon substrate 10 defined by the field oxide film.

A polycrystalline silicon film (not illustrated), for example, with a thickness of 180 nm, and a tungsten silicide film (not illustrated), for example, with a thickness of 20 nm are deposited over the whole surface, for example, by the CVD.

Figure 14B:
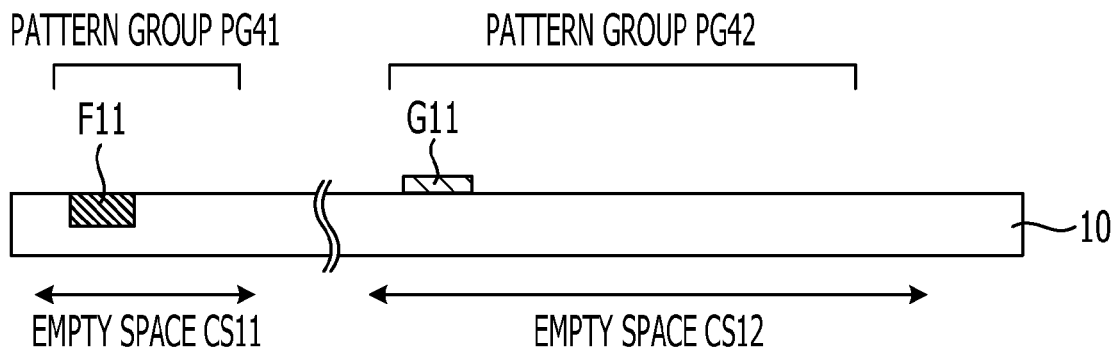

The tungsten silicide film and the polycrystalline silicon film are patterned by photolithography and dry etching to form a pattern of a gate electrode with a tungsten polycide structure (not illustrated). A pattern of a gate alignment mark G11 is formed over the scribe line by a conductive material that forms the gate electrode (FIG. 14B). The gate alignment mark G11 is allocated to the pattern group PG42 and is formed over a left side region of the empty space CS12 over the scribe line.

In the photolithography, a position is aligned using the field alignment mark F11 formed over the scribe line as a reference and the photo resist film is patterned.

A silicon oxide film, for example, with a thickness of 1,000 nm is deposited over the whole surface, for example, by the CVD and the surface of the deposited silicon oxide film is planarized, for example, by the CMP to form the first interlayer insulation film 12 that is a silicon oxide film.

Figure 14C:
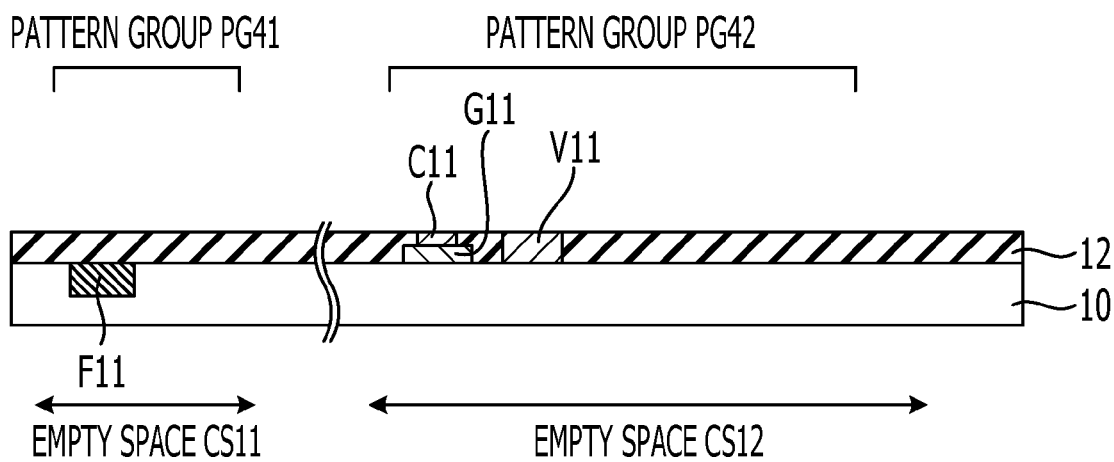

A pattern of a contact hole (for example, a substrate contact and a gate contact) (not illustrated) for coupling with a semiconductor device formed over a device region is formed over the first interlayer insulation film 12 by photolithography and dry etching. A pattern of the contact mark V11 and the image processing inhibition pattern C11 are formed over the scribe line by an opening formed in the first interlayer insulation film 12 (FIG. 14C). Here, the contact mark V11 is allocated to the pattern group PG42 and is formed with a margin for aligning a position over a right side of a region where the gate alignment mark G11 is formed. The image processing inhibition pattern C11 is for making the gate alignment mark G11 ineffective and, for example, the pattern illustrated in FIG. 7B is formed over the gate alignment mark G11. By forming the image processing inhibition pattern C11, the gate alignment mark G11 beneath the image processing inhibition pattern C11 is not detected as an image processing application mark by an exposure process of lithography thereafter.

In the photolithography, a position is aligned using the field alignment mark F11 or the gate alignment mark G11 formed over the scribe line as a reference and the photo resist film is patterned.

A conductive film such as tungsten, for example, with a thickness of 300 nm is deposited over the first interlayer insulation film 12, for example, by the CVD. The conductive film over the first interlayer insulation film is removed, for example, by the CMP to leave the conductive film in the contact hole and the trenches of the contact mark V11 and the image processing inhibition pattern C11. As a result, a first contact plug (not illustrated) of the conductive film is formed in the contact hole.

A conductive film such as aluminum (not illustrated), for example, with a thickness of 500 nm is formed, for example, by Physical Vapor Deposition (PVD) over the first interlayer insulation film 12 in which the first contact plug is buried.

Figure 14D:
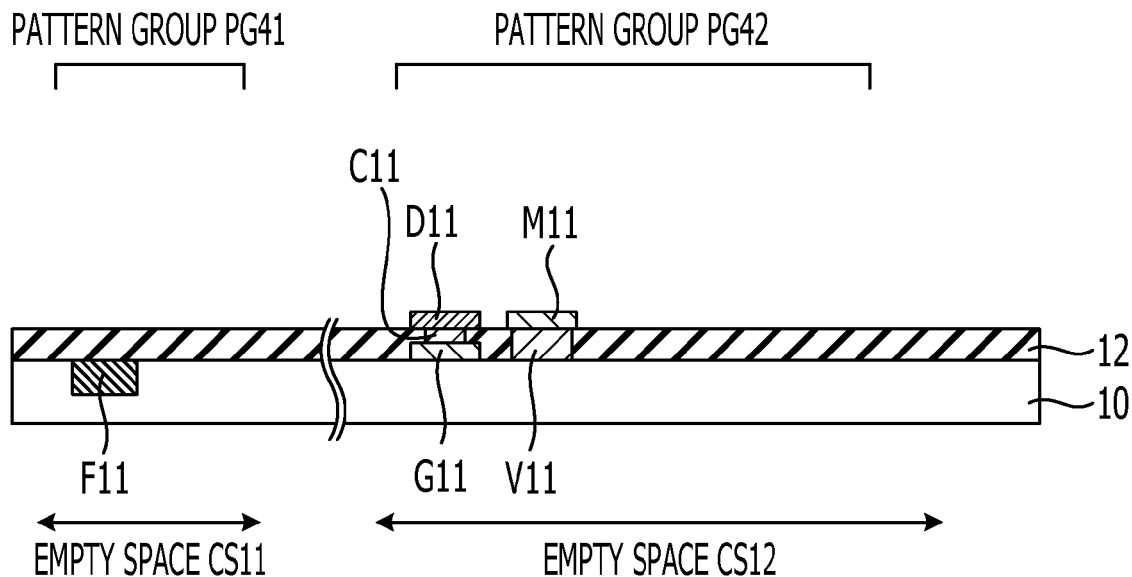

A conductive film is patterned by photolithography and dry etching to form a pattern of a first wiring layer (not illustrated) that is coupled to the device region through the first contact plug. Patterns of the wiring mark M11 and the cover pattern D11 are formed over the scribe line by a conductive material that forms the first wiring layer (FIG. 14D). Here, the wiring mark M11 is allocated to the pattern group PG42, and is formed over the contact mark V11. The cover pattern D11 is formed over the image processing inhibition pattern C11.

The wiring mark M11 conceals the contact mark V11 and forms a new image processing application mark. The contact mark V11 beneath the wiring mark M11 is not detected as an image processing application mark by an exposure process of lithography thereafter because of the wiring mark M11.

In the photolithography, a position is aligned using the contact mark V11 formed over the scribe line as a reference and the photo resist film is patterned.

When a position is aligned using the contact mark V11 as a reference, the gate alignment mark G11 exists in the image processing detection area. However, the image processing inhibition pattern C11 is formed over an upper layer of the gate alignment mark G11, and a conductive film (not illustrated) such as aluminum is formed over the first interlayer insulation film 12, and therefore, the gate alignment mark G11 is not erroneously detected in an image processing process for detecting the contact mark V11.

A silicon oxide film, for example, with a thickness of 800 nm is deposited, for example, by the CVD over the first interlayer insulation film 12 over which the first wiring layer is formed and the surface of the deposited silicon oxide film is planarized, for example, by the CMP to form the second interlayer insulation film 14 that is a silicon oxide film.

Figure 14E:
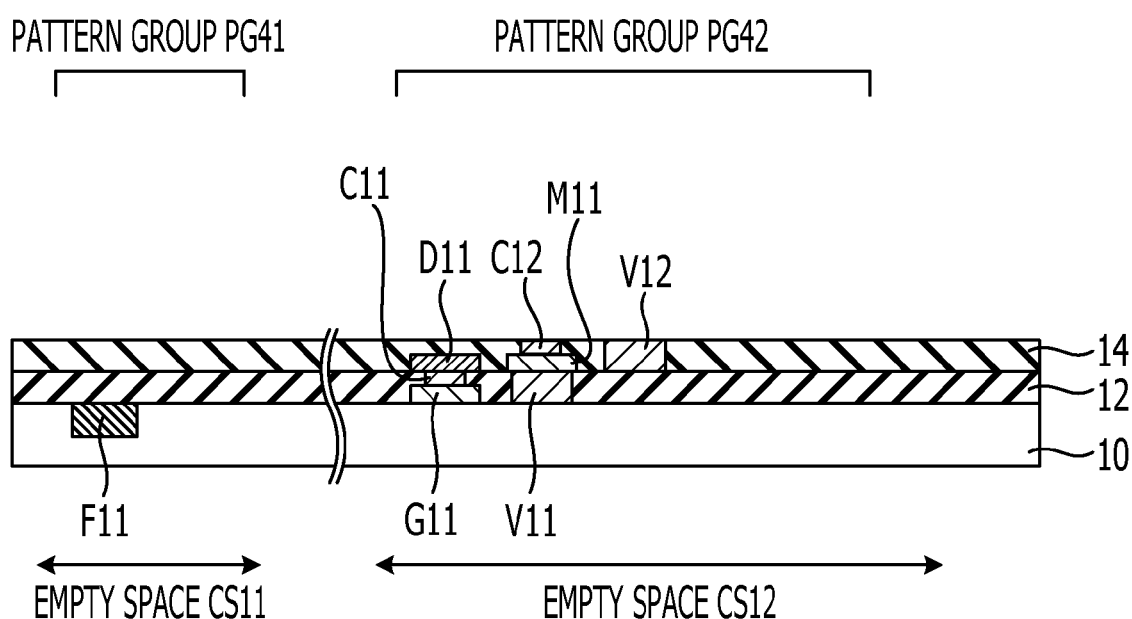

A pattern of a contact hole (not illustrated) for coupling with the first wiring layer is formed over the second interlayer insulation film 14 by photolithography and dry etching. Patterns of the contact mark V12 and the image processing inhibition pattern C12 are formed over the scribe line by an opening formed in the second interlayer insulation film 14 (FIG. 14E). The contact mark V12 is allocated to the pattern group PG42 and is formed with a margin for aligning a position over a right side of a region where the wiring mark M11 is formed. The image processing inhibition pattern C12 is for making the wiring mark M11 ineffective and, for example, the pattern illustrated in FIG. 7B is formed over the wiring mark M11. By forming the image processing inhibition pattern C12, the wiring mark M11 beneath the image processing inhibition pattern C12 is not detected as an image processing application mark by an exposure process of lithography thereafter.

In the photolithography, a position is aligned using the wiring mark M11 formed over the scribe line as a reference and the photo resist film is patterned.

When a position is aligned using the wiring mark M11 as a reference, the gate alignment mark G11 exists in the image processing detection area. However, the image processing inhibition pattern C11 and the cover pattern D11 are formed over an upper layer of the gate alignment mark G11, and therefore, the gate alignment mark G11 is not erroneously detected in an image processing process for detecting the contact mark V11.

A conductive film such as tungsten, for example, with a thickness of 300 nm is deposited over the second interlayer insulation film 14, for example, by the CVD. The conductive film over the second interlayer insulation film is removed, for example, by the CMP to leave the conductive film in the contact hole, and the trenches of the contact mark V12 and the image processing inhibition pattern C12. As a result, a second contact plug (not illustrated) of the conductive film is formed in the contact hole.

A conductive film such as aluminum, for example, with a thickness of 500 nm is formed, for example, by the PVD over the second interlayer insulation film 14 in which the second contact plug is buried.

Figure 14F:
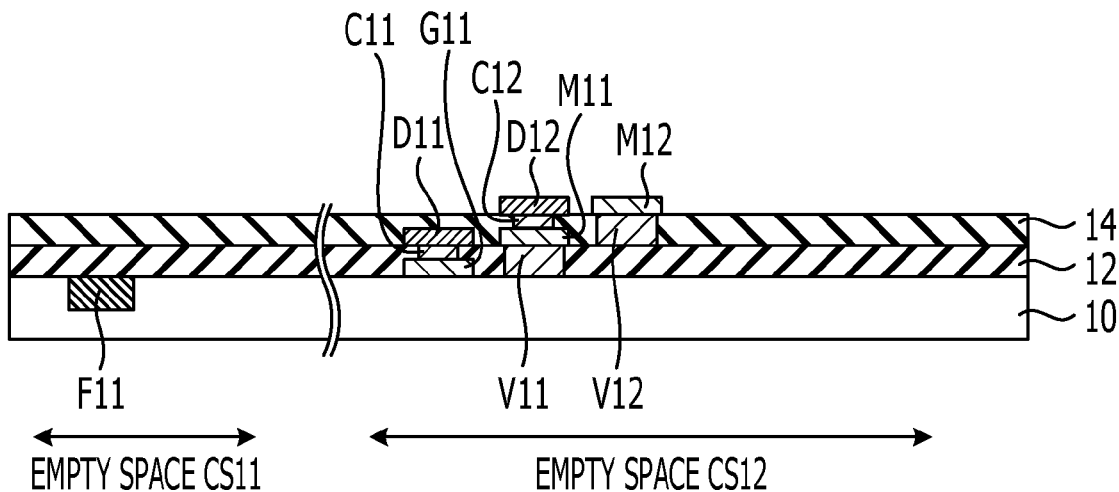

A conductive film is patterned by photolithography and dry etching to pattern a second wiring layer (not illustrated) that is coupled to the first wiring layer through the second contact plug. Patterns of the wiring mark M12 and the cover pattern D12 are formed over the scribe line by a conductive material that forms the second wiring layer (FIG. 14F). The wiring mark M12 is allocated to the pattern group PG42 and is formed over the contact mark V12. The cover pattern D12 is formed over the image processing inhibition pattern C12.

The wiring mark M12 conceals the contact mark V12 and forms a new image processing application mark. The contact mark V12 beneath the wiring mark M12 is not detected as an image processing application mark by an exposure process of lithography thereafter because of the wiring mark M12.

In the photolithography, a position is aligned using the contact mark V12 formed over the scribe line as a reference and the photo resist film is patterned.

When a position is aligned using the contact mark V12 as a reference, the gate alignment mark G11 and the wiring mark M11 exist in the image processing detection area. However, the image processing inhibition pattern C11 and the cover pattern D11 are formed over an upper layer of the gate alignment mark G11, the image processing inhibition pattern C12 is formed over an upper layer of the wiring mark M11, and a conductive film (not illustrated) such as aluminum is formed over the second interlayer insulation film 14, and therefore, the gate alignment mark G11 and the wiring mark M11 are not erroneously detected in an image processing process for detecting the contact mark V12.

A silicon oxide film, for example, with a thickness of 800 nm is deposited, for example, by the CVD over the second interlayer insulation film 14 over which the second wiring layer is formed and the surface of the deposited silicon oxide film is planarized, for example, by the CMP to form the third interlayer insulation film 16 that is a silicon oxide film.

Figure 14G:
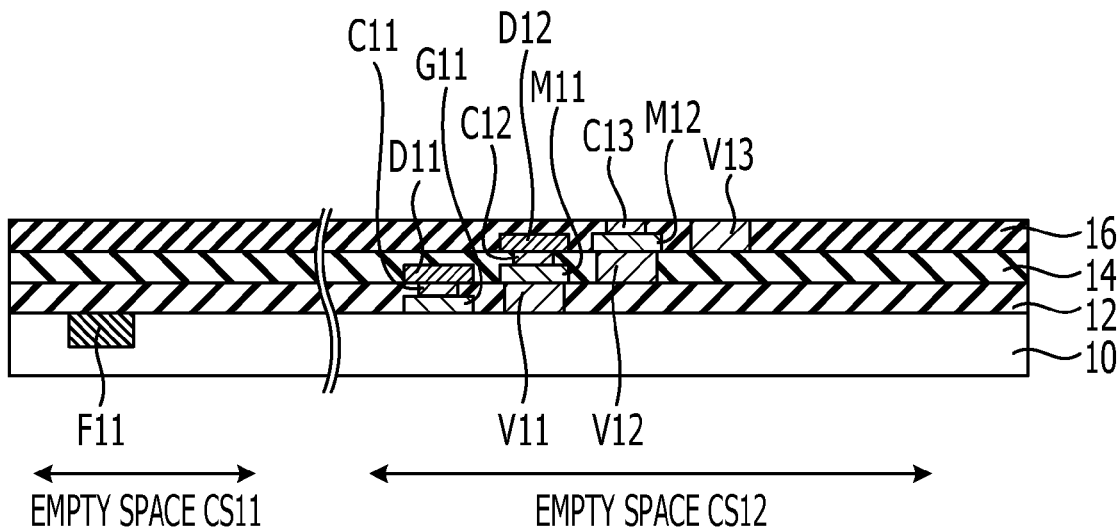

A pattern of a contact hole (not illustrated) for coupling with the second wiring layer is formed over the third interlayer insulation film 16 by photolithography and dry etching. Patterns of the contact mark V13 and the image processing inhibition pattern C13 are formed over the scribe line by an opening formed in the third interlayer insulation film 16 (FIG. 14G). Here, the contact mark V13 is allocated to the pattern group PG42 and is formed with a margin for aligning a position over a right side of a region where the wiring mark M12 is formed. The image processing inhibition pattern C13 is for making the wiring mark M12 ineffective and, for example, the pattern illustrated in FIG. 7B is formed over the wiring mark M12. By forming the image processing inhibition pattern C13, the wiring mark M12 beneath the image processing inhibition pattern C13 is not detected as an image processing application mark by an exposure process of lithography thereafter.

In the photolithography, a position is aligned using the wiring mark M12 formed over the scribe line as a reference and the photo resist film is patterned.

When a position is aligned using the wiring mark M12 as a reference, the gate alignment mark G11 and the wiring mark M11 exist in the image processing detection area. However, the image processing inhibition pattern C11 and the cover pattern D11 are formed over an upper layer of the gate alignment mark G11, and the image processing inhibition pattern C12 and the cover pattern D12 are formed over an upper layer of the wiring mark M11 and therefore, the gate alignment mark G11 and the wiring mark M11 are not erroneously detected in an image processing process for detecting the wiring mark M12.

A conductive film such as tungsten, for example, with a thickness of 300 nm is deposited over the third interlayer insulation film 16, for example, by the CVD. The conductive film over the third interlayer insulation film 16 is removed, for example, by the CMP to leave the conductive film in the contact hole and the trenches of the contact mark V13 and the image processing inhibition pattern C13. As a result, a third contact plug (not illustrated) of the conductive film is formed in the contact hole.

A conductive film such as aluminum, for example, with a thickness of 500 nm is formed, for example, by the PVD over the third interlayer insulation film 16 in which the third contact plug is buried.

Figure 14H:
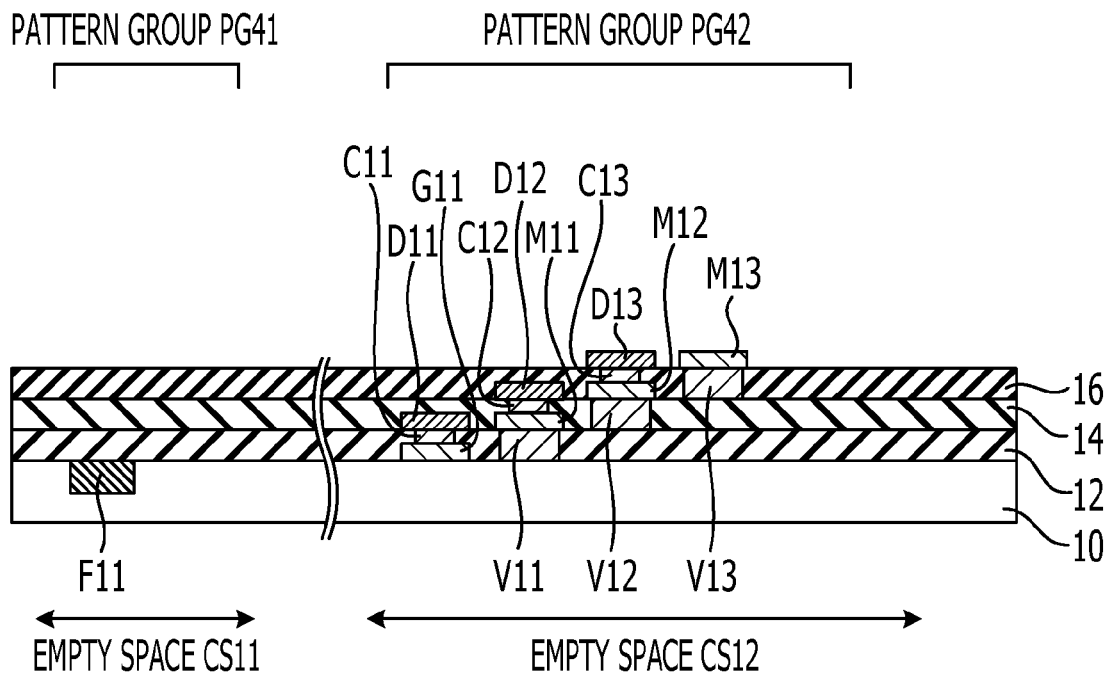

A conductive film is patterned by photolithography and dry etching to pattern a third wiring layer (not illustrated) that is coupled to the second wiring layer through the third contact plug. Patterns of the wiring mark M13 and the cover pattern D13 are formed over the scribe line by a conductive material that forms the third wiring layer (FIG. 14H). Here, the wiring mark M13 is allocated to the pattern group PG42 and is formed over the contact mark V13. The cover pattern D13 is formed over the image processing inhibition pattern C13.

The wiring mark M13 conceals the contact mark V13 and forms a new image processing application mark. The contact mark V13 beneath the wiring mark M13 is not detected as an image processing application mark by an exposure process of lithography thereafter because of the wiring mark M13.

In the photolithography, a position is aligned using the contact mark V13 formed over the scribe line as a reference and the photo resist film is patterned.

When a position is aligned using the contact mark V13 as a reference, the gate alignment mark G11, the wiring mark M11, and the wiring mark M12 exist in the image processing detection area. However, the image processing inhibition pattern C11 and the cover pattern D11 are formed over an upper layer of the gate alignment mark G11, the image processing inhibition pattern C12 and the cover pattern D12 are formed over an upper layer of the wiring mark M11, the image processing inhibition pattern C13 is formed over an upper layer of the wiring mark M12, and a conductive film (not illustrated) such as aluminum is formed over the third interlayer insulation film 16. Thus, the gate alignment mark G11, the wiring mark M11, and the wiring mark M12 are not erroneously detected in an image processing process for detecting the contact mark V13.

A silicon oxide film, for example, with a thickness of 800 nm is deposited, for example, by the CVD over the third interlayer insulation film 16 over which the third wiring layer is formed and the surface of the deposited silicon oxide film is planarized, for example, by the CMP to form the fourth interlayer insulation film 18 that is a silicon oxide film.

Figure 14I:
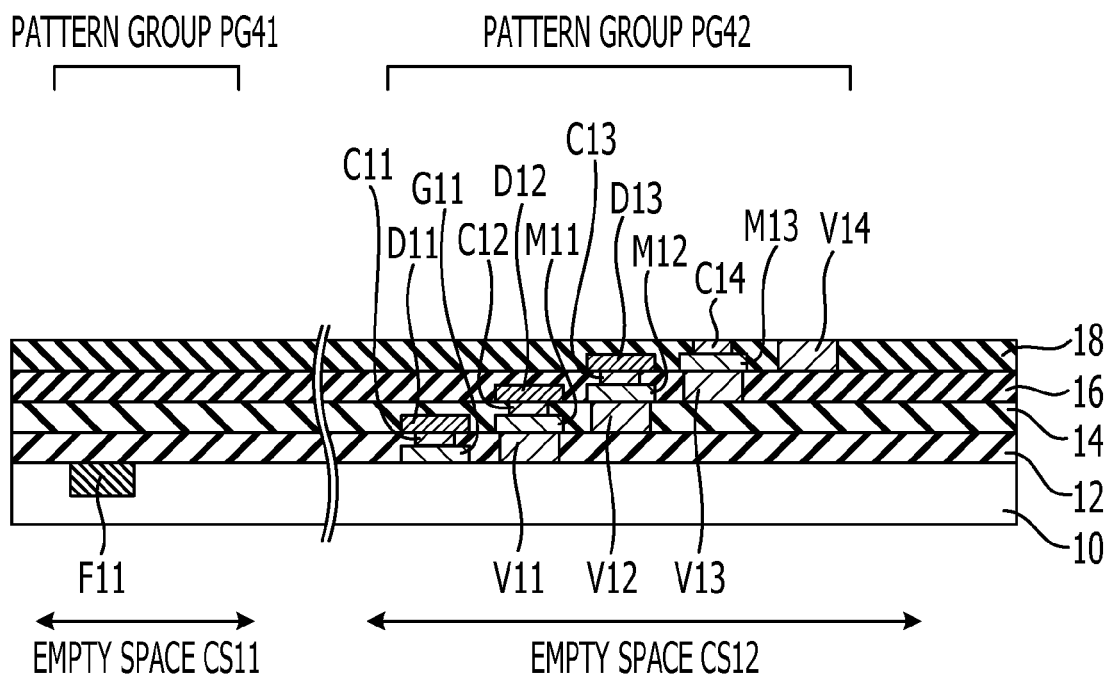

A pattern of a contact hole (not illustrated) for coupling with the third wiring layer is formed over the fourth interlayer insulation film 18 by photolithography and dry etching. Patterns of the contact mark V14 and the image processing inhibition pattern C14 are formed over the scribe line by an opening formed in the fourth interlayer insulation film 18 (FIG. 14I). Here, the contact mark V14 is allocated to the pattern group PG42 and is formed with a margin for aligning a position over a right side of a region where the wiring mark M13 is formed. The image processing inhibition pattern C14 is for making the wiring mark M13 ineffective and, for example, the pattern illustrated in FIG. 7B is formed over the wiring mark M13. By forming the image processing inhibition pattern C14, the wiring mark M13 beneath the image processing inhibition pattern C14 is not detected as an image processing application mark by an exposure process of lithography thereafter.

In the photolithography, a position is aligned using the wiring mark M13 formed over the scribe line as a reference and the photo resist film is patterned.

When a position is aligned using the wiring mark M13 as a reference, the gate alignment mark G11, the wiring mark M11, and the wiring mark M12 exist in the image processing detection area. However, the image processing inhibition pattern C11 and the cover pattern D11 are formed over an upper layer of the gate alignment mark G11, the image processing inhibition pattern C12 and the cover pattern D12 are formed over an upper layer of the wiring mark M11, and the image processing inhibition pattern C13 and the cover pattern D13 are formed over an upper layer of the wiring mark M12. Thus, the gate alignment mark G11, the wiring mark M11, and the wiring mark M12 are not erroneously detected in an image processing process for detecting the wiring mark M13.

A conductive film such as tungsten, for example, with a thickness of 300 nm is deposited over the fourth interlayer insulation film 18, for example, by the CVD. The conductive film over the fourth interlayer insulation film is removed, for example, by the CMP to leave the conductive film in the contact hole and the trench of the contact mark V14. As a result, a fourth contact plug (not illustrated) of the conductive film is formed in the contact hole.

A conductive film such as aluminum, for example, with a thickness of 800 nm is formed, for example, by the PVD over the fourth interlayer insulation film 18 in which the fourth contact plug is buried.

Figure 14J:
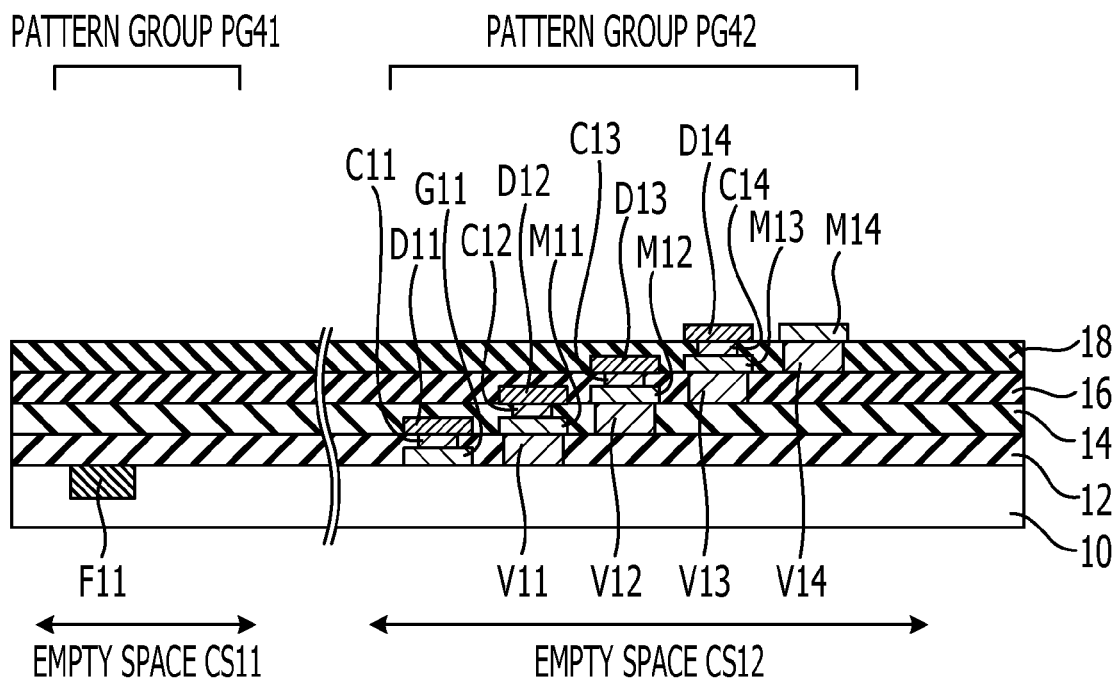

A conductive film is patterned by photolithography and dry etching to pattern a fourth wiring layer (not illustrated) that is coupled to the third wiring layer through the fourth contact plug. The fourth wiring layer includes a lead-out wiring to a wire bonding pad, for example. Patterns of the wiring mark M14 and the cover pattern D14 are formed over the scribe line by a conductive material that forms the fourth wiring layer (FIG. 14J). Here, the wiring mark M14 is allocated to the pattern group PG42 and is formed over the contact mark V14. The cover pattern D14 is formed over the image processing inhibition pattern C14.

The wiring mark M14 conceals the contact mark V14 and forms a new image processing application mark. The contact mark V14 beneath the wiring mark M14 is not detected as an image processing application mark by an exposure process of lithography thereafter because of the wiring mark M14.

In the photolithography, a position is aligned using the contact mark V14 formed over the scribe line as a reference and the photo resist film is patterned.

When a position is aligned using the contact mark V14 as a reference, the gate alignment mark G11, the wiring mark M11, the wiring mark M12, and the wiring mark M13 exist in the image processing detection area. However, the image processing inhibition pattern C11 and the cover pattern D11 are formed over an upper layer of the gate alignment mark G11, the image processing inhibition pattern C12 and the cover pattern D12 are formed over an upper layer of the wiring mark M11, the image processing inhibition pattern C13 and the cover pattern D13 are formed over an upper layer of the wiring mark M12, the image processing inhibition pattern C14 is formed over an upper layer of the wiring mark M13, and a conductive film (not illustrated) such as aluminum is formed over the fourth interlayer insulation film 18. Thus, the gate alignment mark G11, the wiring mark M11, the wiring mark M12, and the wiring mark M13 are not erroneously detected in an image processing process for detecting the contact mark V14.

Figure 14K:
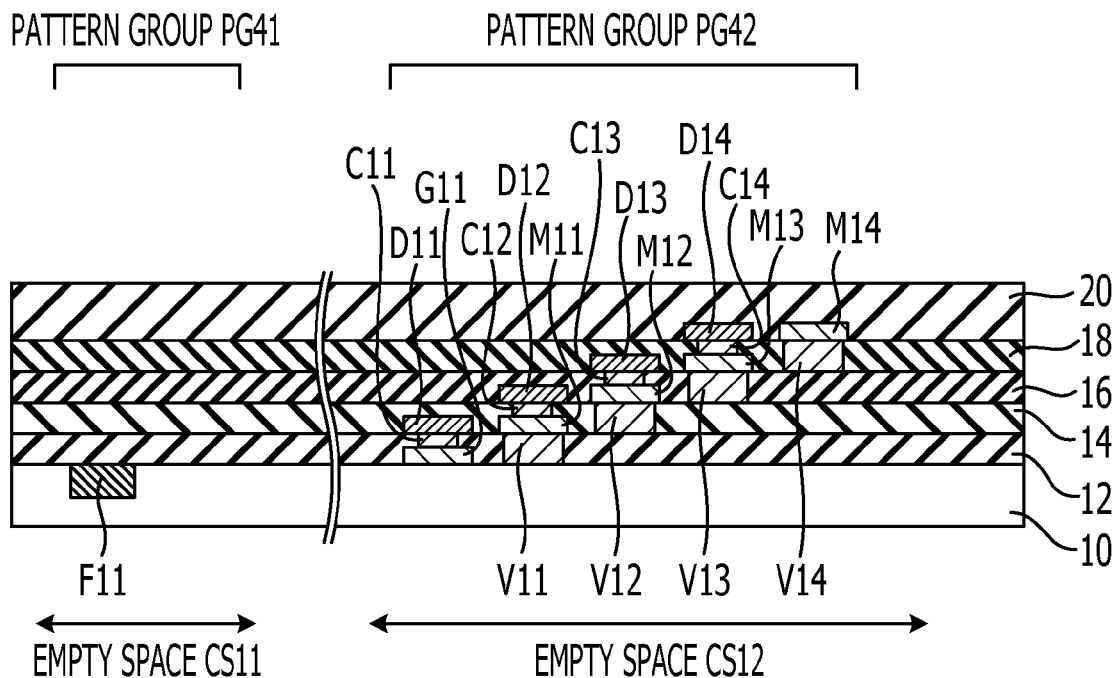

An insulation film with high water-proof property such as a Spin On Glass (SOG) film, for example, with a thickness of 1,200 nm is deposited, for example, by a spin coating method to form a passivation film 20 over the fourth interlayer insulation film 18 over which the fourth wiring layer is formed (FIG. 14K).

A pad opening (not illustrated) that reaches the fourth wiring layer is formed in the passivation film 20 by the photolithography and dry etching.

In the photolithography, a position is aligned using the wiring mark M14 formed over the scribe line as a reference and the photo resist film is patterned.

When a position is aligned using the wiring mark M14 as a reference, the gate alignment mark G11, the wiring mark M11, the wiring mark M12, and the wiring mark M13 exist in the image processing detection area. However, the image processing inhibition pattern C11 and the cover pattern D11 are formed over an upper layer of the gate alignment mark G11, the image processing inhibition pattern C12 and the cover pattern D12 are formed over an upper layer of the wiring mark M11, and the image processing inhibition pattern C13 and the cover pattern D13 are is formed over an upper layer of the wiring mark M12, and the image processing inhibition pattern C14 and the cover pattern D14 are formed over an upper layer of the wiring mark M13. Thus, the gate alignment mark G11, the wiring mark M11, the wiring mark M12, and the wiring mark M13 are not erroneously detected in an image processing process for detecting the wiring mark M14.

The semiconductor device according to the embodiment is completed through the above-described processes.

As described above, according to the embodiment, a limitation to arrange another image processing application mark over the used image processing application mark may be canceled out because an image processing inhibition pattern with a shape that changes or conceals a position of a pattern edge of the used image processing application mark is formed over the used image processing application mark. As a result, a plurality of image processing application marks may be arranged within an area corresponding to one field of the view of the image detector of the exposure device, and thereby flexibility to arrange image processing application marks may be improved. Moreover, an area to arrange the image processing application marks may be reduced.

Alternative Embodiments

Various alternative embodiments may be possible other than the above-described embodiments.

For example, the number of pattern groups to which image processing application marks are allocated and the number of image processing application marks that are included in each pattern group are not limited to those described in the embodiments. The numbers may be set as appropriate according to the number of and a size of empty spaces over the scribe line and chips dedicated to the process patterns.

For example, according to the third embodiment, the field alignment mark F11 may be allocated to the pattern group PG42 and arranged in the empty space CS12. In this case, an image processing inhibition pattern that is formed substantially the same time as when the contact mark V11 is formed and a cover pattern that is formed substantially the same time as when the cover pattern D11 is formed are formed over the field alignment mark F11 so that the field alignment mark F11 is not detected at processes thereafter.

When a plurality of alignment marks are arranged within an area corresponding to one field of view of the image detector of the exposure device, image processing inhibition patterns may be sequentially formed over the used alignment marks as described in the third embodiment.

In the above-described embodiments, the four-layer wiring semiconductor device is described as an example. However, the number of wiring layers and the structure are not limited to this. The number of wiring layers may be three or less, or five or more.

Moreover, the present disclosure may be applied to a case in which a wiring layer is formed by a damascene method. For example, in a pre-via type dual damascene method, an image processing inhibition pattern that makes an alignment mark of a lower wiring layer ineffective and a contact mark are formed substantially the same time and a wiring trench may be formed by aligning with the contact mark.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device comprising:
    a first alignment mark formed over a semiconductor substrate; and an inhibition pattern arranged over the first alignment mark;
    wherein an edge of the inhibition pattern is located in a mark functional region over the first alignment mark;
    wherein the edge of the inhibition pattern inhibits the first alignment mark being recognized as such by an image detector of an exposure device; and
    wherein the inhibition pattern is formed above the first alignment mark and is separated from the first alignment mark via an insulation film or a third alignment mark.

2. The semiconductor device according to claim 1, wherein the inhibition pattern edge is located in a position that differs, in a horizontal plane, from a position of an edge of the first alignment mark.

3. The semiconductor device according to claim 1, wherein the inhibition pattern is formed by a conductive film.

4. The semiconductor device according to claim 1, wherein the inhibition pattern is formed by an opening formed in an insulation film that covers the first alignment mark.

5. The semiconductor device according to claim 4, further comprising: a cover pattern formed over the inhibition pattern.

6. The semiconductor device according to claim 5, wherein the cover pattern is formed by a conductive film formed over the insulation film.

7. The semiconductor device according to claim 1, wherein irregularities that reflect a shape of the first alignment mark are formed over a surface of the insulation film.

8. The semiconductor device according to claim 1, further comprising:
    a second alignment mark formed over the semiconductor substrate;
    wherein the first alignment mark and the second alignment mark are arranged within an area that corresponds to one field of view of the image detector.

9. A semiconductor device manufacturing method comprising:
    forming a first alignment mark over a semiconductor substrate;
    forming a pattern that includes a second alignment mark over the semiconductor substrate over which the first alignment mark is formed;
    wherein forming the pattern arranges the second alignment mark so that the first alignment mark and the second alignment mark are arranged within an area that corresponds to one field of view of an image detector of an exposure device and forming an inhibition pattern over the first alignment mark, to inhibit the first alignment mark from being recognized by the image detector, wherein the inhibition pattern is separated from the first alignment mark via an insulation film or a third alignment mark.

10. The semiconductor device manufacturing method according to claim 9, wherein forming the pattern forms the inhibition pattern with a pattern edge in a mark functional region of the first alignment mark.

11. A semiconductor device manufacturing method comprising:
    forming a first pattern that includes a first alignment mark over a semiconductor substrate;
    forming, over the semiconductor substrate over which the first pattern is formed, a first inhibition pattern with a pattern edge in a mark functional region of the first alignment mark to inhibit the first alignment mark from being recognized by an image detector of an exposure device and a second pattern that includes a second alignment mark, the first inhibition pattern being formed so that the first inhibition pattern is separated from the first alignment mark via an insulation film or a third alignment mark; and
    forming a third pattern over the semiconductor substrate by aligning with the second alignment mark.

12. The semiconductor device manufacturing method according to claim 11, wherein the second pattern includes a second inhibition pattern; wherein the pattern edge of the second inhibition pattern is located at a different position than the pattern edge of the first alignment mark.

13. The semiconductor device manufacturing method according to claim 11, wherein forming the second pattern arranges the second alignment mark so that the first alignment mark and the second alignment mark are arranged within an area that corresponds to one field of view of the image detector of the exposure device.

14. The semiconductor device manufacturing method according to claim 11, further comprising: forming an insulation film between the first pattern and the second pattern, wherein the second pattern is a conductive film formed over the insulation film.

15. The semiconductor device manufacturing method according to claim 14, wherein the insulation film has irregularities that reflect a shape of the first alignment mark.

16. The semiconductor device manufacturing method according to claim 11, further comprising: forming an insulation film between the first pattern and the second pattern, wherein the second pattern is formed by an opening formed in the insulation film.

17. The semiconductor device manufacturing method according to claim 16, wherein the opening formed in the insulation film has irregularities over the surface that reflect a shape of the first alignment mark.

18. The semiconductor device manufacturing method according to claim 16, wherein forming the third pattern further forms a cover pattern over the inhibition pattern.

\* \* \* \* \*